US009397381B2

(12) United States Patent
Kondou et al.

(10) Patent No.: US 9,397,381 B2
(45) Date of Patent: Jul. 19, 2016

(54) ELECTROMAGNETIC COUPLING STRUCTURE, MULTILAYERED TRANSMISSION LINE PLATE, METHOD FOR PRODUCING ELECTROMAGNETIC COUPLING STRUCTURE, AND METHOD FOR PRODUCING MULTILAYERED TRANSMISSION LINE PLATE

(75) Inventors: Yuusuke Kondou, Chikusei (JP); Etsuo Mizushima, Chikusei (JP); Yasushi Watanabe, Chikusei (JP); Yasuyuki Mizuno, Chikusei (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 268 days.

(21) Appl. No.: 13/983,796

(22) PCT Filed: Nov. 4, 2011

(86) PCT No.: PCT/JP2011/075488
§ 371 (c)(1),
(2), (4) Date: Aug. 27, 2013

(87) PCT Pub. No.: WO2012/108084
PCT Pub. Date: Aug. 16, 2012

(65) Prior Publication Data
US 2013/0328646 A1 Dec. 12, 2013

(30) Foreign Application Priority Data

Feb. 8, 2011 (JP) .............................. P2011-025165
Sep. 27, 2011 (JP) .............................. P2011-211521

(51) Int. Cl.
*H01P 1/06* (2006.01)
*H01P 5/00* (2006.01)
(Continued)

(52) U.S. Cl.
CPC *H01P 5/00* (2013.01); *H01P 5/028* (2013.01); *H01P 5/185* (2013.01); *H01P 11/001* (2013.01); *H05K 1/024* (2013.01); *H05K 2201/0959* (2013.01); *Y10T 29/49016* (2015.01)

(58) Field of Classification Search
CPC .................................. H01P 5/00; H01P 11/001
USPC ........................ 333/238, 24 R, 246, 123, 260
See application file for complete search history.

(56) References Cited

U.S. PATENT DOCUMENTS 4,130,822 A * 12/1978 Conroy ................ H01Q 13/106
333/246
5,093,639 A 3/1992 Franchi et al.
(Continued)

FOREIGN PATENT DOCUMENTS

CN 1 392 755 A 1/2003
CN 1 459 811 A 12/2003
(Continued)

OTHER PUBLICATIONS

Office Action of DE Appln. No. 112011104858.0 dated Jun. 20, 2014.
(Continued)

*Primary Examiner* — Dinh T Le
(74) *Attorney, Agent, or Firm* — Fitch, Even, Tabin & Flannery, LLP

(57) ABSTRACT

This electromagnetic coupling structure includes a laminated body that is laminated with an inner dielectric layer interposed between inner conductive layers, one pair of outer dielectric layers facing each other with the laminated body interposed therebetween, and one pair of outer conductive layers facing each other with the one pair of outer dielectric layers interposed therebetween. The one pair of outer conductive layers include wiring portions and conductive patch portions disposed at front ends of the wiring portions, and the conductive patch portions have portions longer than the wiring portions in a direction perpendicular to an extending direction of the wiring portions. In the laminated body, a hole passing through the inner dielectric layer and the inner conductive layers is arranged, and the one pair of outer conductive layers are electromagnetically coupled through a metal film formed inside the hole.

12 Claims, 14 Drawing Sheets

(51) Int. Cl.
 *H01P 5/18* (2006.01)
 *H01P 5/02* (2006.01)
 *H01P 11/00* (2006.01)
 *H05K 1/02* (2006.01)

(56) References Cited

U.S. PATENT DOCUMENTS 5,471,181 A * 11/1995 Park ............... H01P 5/187
 333/246
2013/0057365 A1 * 3/2013 Mizushima ............ H01P 1/047
 333/238

FOREIGN PATENT DOCUMENTS

| CN | 1 669 371 A | 9/2005 |
|---|---|---|
| CN | 101061762 A | 10/2007 |
| EP | 1 923 950 A1 | 5/2008 |
| JP | H 6-291536 A | 10/1994 |
| JP | 11-261308 | 9/1999 |
| JP | 3323087 B2 | 9/2002 |
| JP | 2003-017909 | 1/2003 |
| JP | 2006-101286 | 4/2006 |
| JP | 2007-243123 | 9/2007 |
| JP | 2011-211170 | 10/2011 |
| KR | 200550117316 | 12/2005 |
| KR | 10-0706024 | 4/2007 |
| WO | WO 2004/051790 A2 | 6/2004 |

OTHER PUBLICATIONS

International Search Report of PCT/JP2011/075488 dated Feb. 7, 2012 in English.
International Preliminary Report of PCT/JP2011/075488 dated Aug. 22, 2013 in English.
Office action of CN Appln. No. 201180066680.1 dated Aug. 4, 2014.
Matsunaga et al., Electromagnetic Coupling between Two-Layered Microstriplines, Sep. 15, 1990, p. 397, C-59 with partial translation.
Ho et al., Slot-Coupled Double-Sided Microstrip Interconnects and Couplers, IEEE MITT-S Digest, vol. 3, 1993, p. 1321-1324.
JP Office Action of Appln. No. 2011-211521 dated Feb. 17, 2015.
Notice of Allowance of KR application No. 10-2013-7022718 dated Feb. 12, 2015.

* cited by examiner

Fig.4
(a)
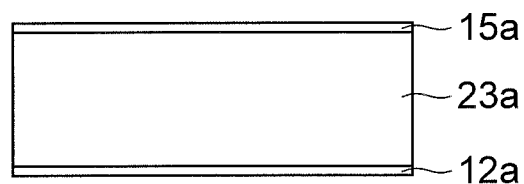
(b)
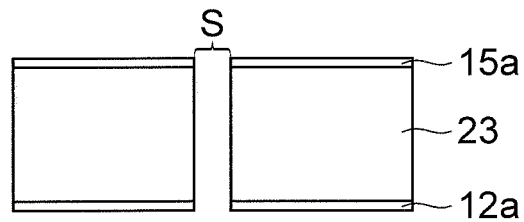
(c)
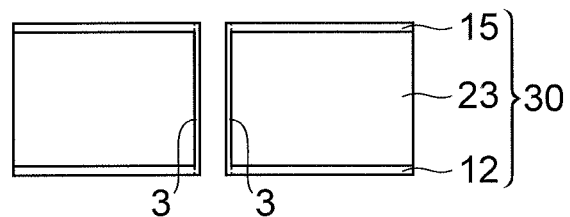

Fig.5
(a)
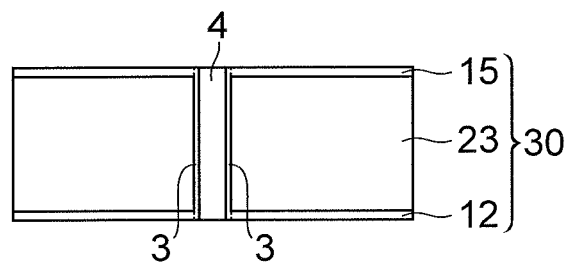
(b)
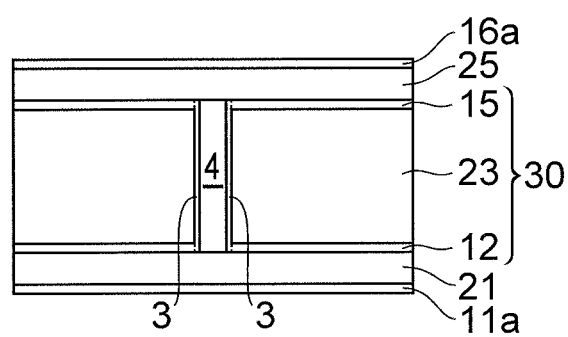
(c)
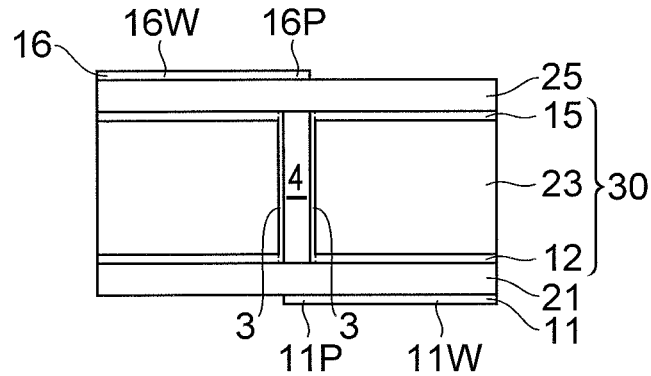

*Fig.8*
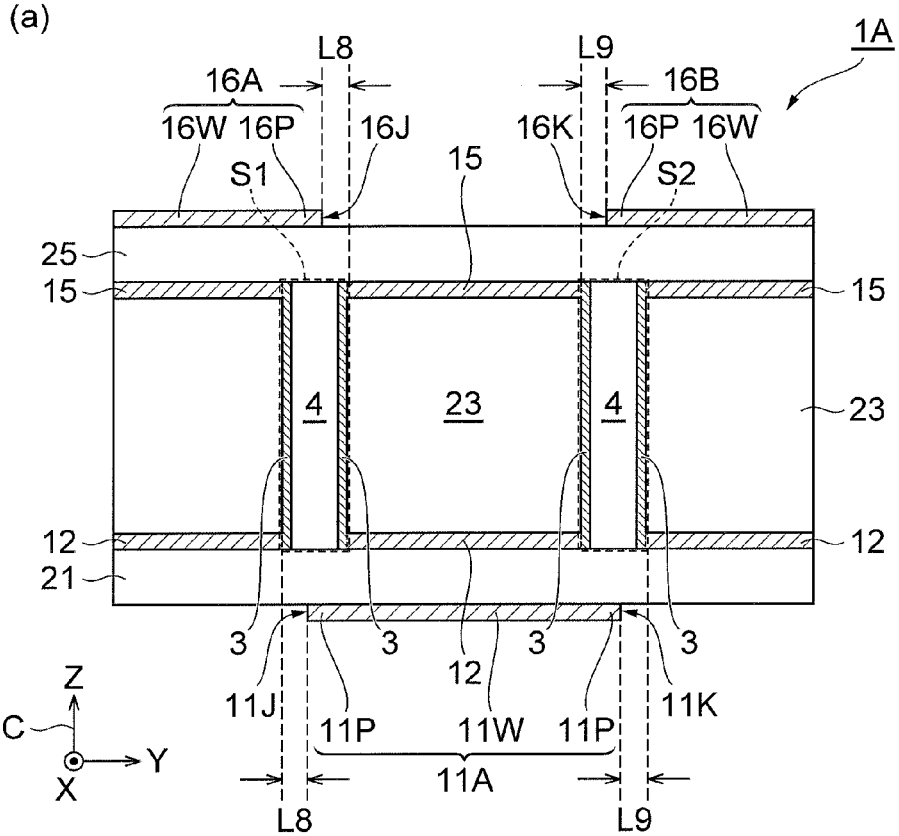
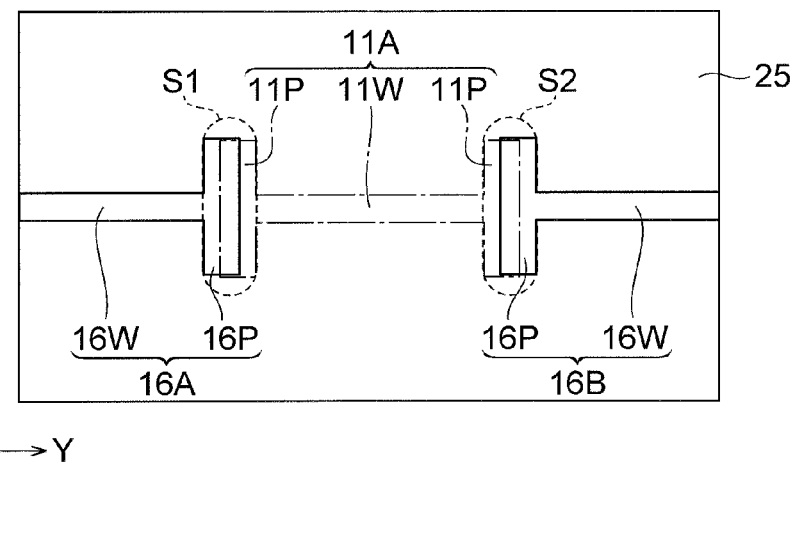

ELECTROMAGNETIC COUPLING STRUCTURE, MULTILAYERED TRANSMISSION LINE PLATE, METHOD FOR PRODUCING ELECTROMAGNETIC COUPLING STRUCTURE, AND METHOD FOR PRODUCING MULTILAYERED TRANSMISSION LINE PLATE

TECHNICAL FIELD

The present invention relates to an electromagnetic coupling structure, a multilayered transmission line plate, a method for producing an electromagnetic coupling structure, and a method for producing a multilayered transmission line plate.

BACKGROUND ART

As a method for electrically connecting layers of a transmission line plate to each other in a high frequency band of a microwave zone or a millimeter wave zone, a method using electromagnetic coupling has been proposed. For example, in Patent Literature 1, electromagnetic coupling between layers of a multilayered wiring plate is described.

CITATION LIST

Patent Literature

Patent Literature 1: U.S. Pat. No. 3,323,087

SUMMARY OF INVENTION

Technical Problem

In the multilayered wiring plate disclosed in Patent Literature 1, a first transmission line, a first dielectric, a ground conductor having a slot hole, a second dielectric, and a second transmission line are formed to be stacked in the mentioned order. The first transmission line is electromagnetically coupled with the second transmission line through the slot hole of the ground conductor.

However, in Patent Literature 1, in order to decrease the loss of a high frequency signal, all the conditions of predetermined four inequalities need to be satisfied which have the frequency f (Hz) of the high frequency signal transmitted through the transmission line, a relative dielectric constant c of the dielectric, a distance ML (mm) from the right upper side of the slot hole to an end portion of the transmission line, the length SL (mm) of the slot hole, and the width SW (mm) of the slot hole as parameters. As above, in a conventional electromagnetic coupling structure, in order to acquire desired transmission characteristics, high dimensional accuracy is necessary.

The present invention is contrived for solving the above-described problem, and an object thereof is to provide an electromagnetic coupling structure, a multilayered transmission line plate, a method for producing an electromagnetic coupling structure, and a method for producing a multilayered transmission line plate that do not require high dimensional accuracy and have a low-loss transmission characteristic.

Solution to Problem

In order to solve the above-described problems, according to the present invention, there is provided an electromagnetic coupling structure used in a frequency band of a microwave zone, the electromagnetic coupling structure comprising: a laminated body that is laminated with an inner dielectric layer interposed between inner conductive layers that are a plurality of ground layers; one pair of outer dielectric layers that face each other with the laminated body interposed between the outer dielectric layers; and one pair of outer conductive layers that face each other with the one pair of outer dielectric layers interposed between the outer conductive layers. Each one of the one pair of outer conductive layers includes a wiring portion and a conductive patch portion disposed at a front end of the wiring portion, and the conductive patch portion has a portion longer than the wiring portion in a direction perpendicular to an extending direction of the wiring portion. A hole passing through the inner dielectric layer and the inner conductive layers that are the plurality of ground layers is formed in the laminated body, and the one pair of outer conductive layers are electromagnetically coupled by electrically connecting the inner conductive layers, which are the plurality of ground layers, through a tube-shaped metal film formed on an inner wall of the hole.

In this electromagnetic coupling structure, the conductive patch portions are disposed at front ends of the wiring portions of the one pair of outer conductive layers that are electromagnetically coupled. As above, by configuring the front ends of the wiring portions of one pair of the outer conductive layers in the shape of a patch, impedance matching between the conductive patch portions and the hole can be performed in an easy manner. At this time, unlike a conventional case, various dimensions of the electromagnetic coupling portions do not need to be precisely managed so as to satisfy predetermined inequalities in accordance with the frequency of a transmission signal and the relative dielectric constant of the dielectric. In other words, in the electromagnetic coupling structure according to the present invention, in the direction perpendicular to the extending direction of the wiring portions, by using the conductive patch portions having portions longer than the wiring portions, even when there are variations in various dimensions of the electromagnetic coupling portions in the manufacturing step, it is hardly influenced by the dimensional precision, whereby superior transmission characteristics can be maintained. Accordingly, the electromagnetic coupling structure can be provided which does not require high dimension precision and has a low-loss transmission characteristic.

In addition, in an electromagnetic coupling structure, which is used in a frequency band of a microwave zone, according to the present invention, a first conductive layer, a first dielectric layer, a second conductive layer, a second dielectric layer, a third conductive layer, a third dielectric layer, and a fourth conductive layer are stacked in this order. Each one of the first and fourth conductive layers includes a wiring portion and a conductive patch portion disposed at a front end of the wiring portion. The conductive patch portion has a portion longer than the wiring portion in a direction perpendicular to an extending direction of the wiring portion. A hole passing through the second conductive layer, the second dielectric layer, and the third conductive layer is formed, and the first conductive layer and the fourth conductive layer are electromagnetically coupled by electrically connecting the second conductive layer and the third conductive layer to each other through a tube-shaped metal film formed on an inner wall of the hole.

In this electromagnetic coupling structure, the conductive patch portions are disposed at front ends of the wiring portions of the first and fourth conductive layers that are electromagnetically coupled. As above, by configuring the front ends of the wiring portions of the first and fourth conductive layers in the shape of a patch, impedance matching between the conductive patch portions and the hole can be performed in an easy manner. At this time, unlike a conventional case, various dimensions of the electromagnetic coupling portions do not need to be precisely managed so as to satisfy predetermined inequalities in accordance with the frequency of a transmission signal and the relative dielectric constant of the dielectric. In other words, in the electromagnetic coupling structure according to the present invention, in the direction perpendicular to the extending direction of the wiring portions, by using the conductive patch portions having portions longer than the wiring portions, even when there are variations in various dimensions of the electromagnetic coupling portions in the manufacturing step, it is hardly influenced by the dimensional precision, whereby superior transmission characteristics can be maintained. Accordingly, the electromagnetic coupling structure can be provided which does not require high dimension precision and has a low-loss transmission characteristic.

In addition, according to the present invention, there is provided a multilayered transmission line plate used in a frequency band of a microwave zone, the multilayered transmission line plate comprising: a laminated body that is laminated with an inner dielectric layer interposed between inner conductive layers that are a plurality of ground layers; one pair of outer dielectric layers that face each other with the laminated body interposed between the outer dielectric layers; and one pair of outer conductive layers that face each other with the one pair of outer dielectric layers interposed between the outer conductive layers and form transmission lines. Each one of the one pair of outer conductive layers includes a wiring portion and a conductive patch portion disposed at a front end of the wiring portion, and the conductive patch portion has a portion longer than the wiring portion in a direction perpendicular to an extending direction of the wiring portion. A hole passing through the inner dielectric layer and the inner conductive layers that are the plurality of ground layers is formed in the laminated body, and the one pair of outer conductive layers are electromagnetically coupled by electrically connecting the inner conductive layers, which are the plurality of ground layers, through a tube-shaped metal film formed on an inner wall of the hole.

In this multilayered transmission line plate, the conductive patch portions are disposed at front ends of the wiring portions of the one pair of outer conductive layers that are electromagnetically coupled. As above, by configuring the front ends of the wiring portions of one pair of the outer conductive layers in the shape of a patch, impedance matching between the conductive patch portions and the hole can be performed in an easy manner. At this time, unlike a conventional case, various dimensions of the electromagnetic coupling portions do not need to be precisely managed so as to satisfy predetermined inequalities in accordance with the frequency of a transmission signal and the relative dielectric constant of the dielectric. In other words, in the multilayered transmission line plate according to the present invention, in the direction perpendicular to the extending direction of the wiring portions, by using the conductive patch portions having portions longer than the wiring portions, even when there are variations in various dimensions of the electromagnetic coupling portions in the manufacturing step, it is hardly influenced by the dimensional precision, whereby superior transmission characteristics can be maintained. Accordingly, the multilayered transmission line plate can be provided which does not require high dimension precision and has a low-loss transmission characteristic.

In addition, in a multilayered transmission line plate, which is used in a frequency band of the microwave zone, according to the present invention, a first conductive layer forming a first transmission line, a first dielectric layer, a second conductive layer, a second dielectric layer, a third conductive layer, a third dielectric layer, and a fourth conductive layer forming a second transmission line are stacked in this order. Each one of the first and fourth conductive layers includes a wiring portion and a conductive patch portion disposed at a front end of the wiring portion, and the conductive patch portion has a portion longer than the wiring portion in a direction perpendicular to an extending direction of the wiring portion. A hole passing through the second conductive layer, the second dielectric layer, and the third conductive layer is formed, and the first conductive layer and the fourth conductive layer are electromagnetically coupled by electrically connecting the second conductive layer and the third conductive layer to each other through a tube-shaped metal film formed on an inner wall of the hole.

In this multilayered transmission line plate, the conductive patch portions are disposed at front ends of the wiring portions of the first and fourth conductive layers that are electromagnetically coupled. As above, by configuring the front ends of the wiring portions of the first and fourth conductive layers in the shape of a patch, impedance matching between the conductive patch portions and the hole can be performed in an easy manner. At this time, unlike a conventional case, various dimensions of the electromagnetic coupling portions do not need to be precisely managed so as to satisfy predetermined inequalities in accordance with the frequency of a transmission signal and the relative dielectric constant of the dielectric. In other words, in the multilayered transmission line plate according to the present invention, in the direction perpendicular to the extending direction of the wiring portions, by using the conductive patch portions having portions longer than the wiring portions, even when there are variations in various dimensions of the electromagnetic coupling portions in the manufacturing step, it is hardly influenced by the dimensional precision, whereby superior transmission characteristics can be maintained. Accordingly, the multilayered transmission line plate can be provided which does not require high dimension precision and has a low-loss transmission characteristic.

In addition, in the above-described electromagnetic coupling structure, it is preferable that a width of the hole in a direction perpendicular to the extending direction of the wiring portion be set to be an effective wavelength corresponding to a frequency used in the frequency band or less.

In addition, in the above-described multilayered transmission line plate, it is preferable that a width of the hole in a direction perpendicular to the extending direction of the wiring portion be set to be an effective wavelength corresponding to a frequency used in the frequency band or less.

By setting the width of the hole as above, the electromagnetic coupling structure having a low-loss transmission characteristic can be formed.

In addition, in the above-described electromagnetic coupling structure or the above-described multilayered transmission line plate, it is preferable that a dielectric having dielectric loss tangent of 0 to 0.0300 at 10 GHz be filled in the hole in which the tube-shaped metal film is formed.

Since the transmission loss increases in proportion to the dielectric loss tangent of the material, by filling a dielectric having low dielectric loss tangent in the hole, the transmission loss can be suppressed.

In addition, air may be filled in the hole in which the tube-shaped metal film is formed. Also in such a case, similarly to the case where the dielectric is filled in the hole, the transmission loss is suppressed. In addition, the process of filling the dielectric can be further simplified, which is preferable.

Furthermore, according to the present invention, there is provided a method of producing an electromagnetic coupling structure used in a frequency band of a microwave zone, the method comprising: forming a laminated body in which an inner dielectric layer is arranged between inner conductive layers that are a plurality of ground layers; providing a hole that passes through the inner dielectric layer and the inner conductive layers that are the plurality of ground layers in the laminated body; providing a tube-shaped metal film on an inner wall of the hole; forming one pair of outer dielectric layers facing each other with the laminated body interposed between the outer dielectric layers; and forming one pair of outer conductive layers facing each other with the one pair of outer dielectric layers interposed between the outer conductive layers. Each one of the one pair of the outer conductive layers includes a wiring portion and a conductive patch portion disposed at a front end of the wiring portion, and the one pair of the outer conductive layers are formed such that the conductive patch portion has a portion longer than the wiring portion in a direction perpendicular to an extending direction of the wiring portion. According to the production method, the above-described electromagnetic coupling structure can be efficiently produced.

In addition, according to the present invention, there is provided a method of producing a multilayered transmission line plate used in a frequency band of a microwave zone, the method comprising: forming a laminated body in which an inner dielectric layer is arranged between inner conductive layers that are a plurality of ground layers; providing a hole that passes through the inner dielectric layer and the inner conductive layers that are the plurality of ground layers in the laminated body; providing a tube-shaped metal film on an inner wall of the hole; forming one pair of outer dielectric layers facing each other with the laminated body interposed between the outer dielectric layers; and forming one pair of outer conductive layers facing each other with the one pair of outer dielectric layers interposed between the outer conductive layers. Each one of the one pair of the outer conductive layers includes a wiring portion and a conductive patch portion disposed at a front end of the wiring portion, and the one pair of the outer conductive layers are formed such that the conductive patch portion has a portion longer than the wiring portion in a direction perpendicular to an extending direction of the wiring portion. According to this production method, the above-described transmission line plate can be efficiently produced.

Furthermore, in the above-described method of producing an electromagnetic coupling structure or a multilayered transmission line plate, it is preferable to form the tube-shaped metal film by plating from a viewpoint of further improving the production efficiency.

In addition, in the above-described method of producing an electromagnetic coupling structure or a multilayered transmission line plate, it is preferable to further include filling a dielectric having dielectric loss tangent of 0 to 0.0300 at 10 GHz in the hole in which the tube-shaped metal film is formed.

Since the transmission loss increases in proportion to the dielectric loss tangent of the material, by filling a dielectric having low dielectric loss tangent in the hole, the transmission loss can be suppressed.

In addition, it is preferable to further comprise filling air in the hole in which the tube-shaped metal film is formed. Also in such a case, similarly to the case where the dielectric is filled in the hole, the transmission loss is suppressed. In addition, the process of filling the dielectric can be further simplified, which is preferable.

Advantageous Effects of Invention

According to the present invention, an electromagnetic coupling structure, a multilayered transmission line plate, a method for producing an electromagnetic coupling structure, and a method for producing a multilayered transmission line plate that do not require high dimensional accuracy and have a low-loss transmission characteristic can be provided.

BRIEF DESCRIPTION OF DRAWINGS

FIGS. 4(a) to 4(c) are diagrams that illustrate an example of a method for producing a multilayered transmission line plate having an electromagnetic coupling structure according to this embodiment.

FIGS. 5(a) to 5(c) are diagrams that illustrate an example of a method for producing a multilayered transmission line plate having an electromagnetic coupling structure according to this embodiment.

FIG. 8(a) is a cross-sectional view that illustrates a structure used for measuring a high-frequency characteristic of a multilayered transmission line plate having an electromagnetic coupling structure according to an example. FIG. 8(b) is a top view that illustrates the structure used for measuring a high frequency characteristic of a multilayered transmission line plate having an electromagnetic coupling structure according to an example.

DESCRIPTION OF EMBODIMENTS

Figure 1:
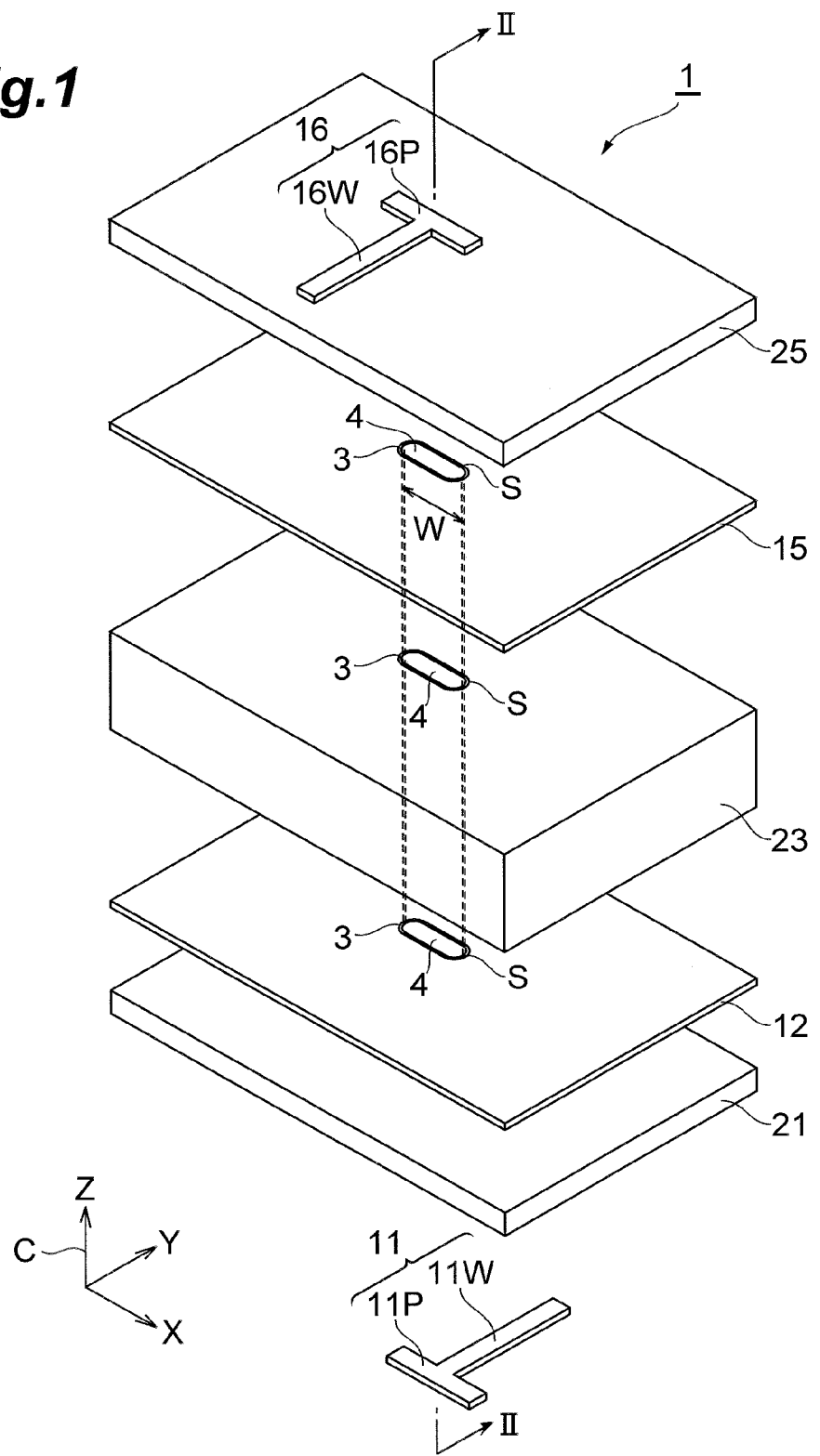
FIG. 1 is an exploded perspective view that illustrates a multilayered transmission line plate having an electromagnetic coupling structure according to this embodiment.

Hereinafter, multilayered transmission line plates according to preferred embodiments of the present invention will be described in detail with reference to the drawings. In the drawings, an XYZ orthogonal coordinate system C is represented.

The multilayered transmission line plate having an electromagnetic coupling structure according to this embodiment is used in a high frequency band of the microwave zone. Specifically, the frequency band of the microwave zone described here is a frequency zone of 10 GHz to 100 GHz.

Figure 2:
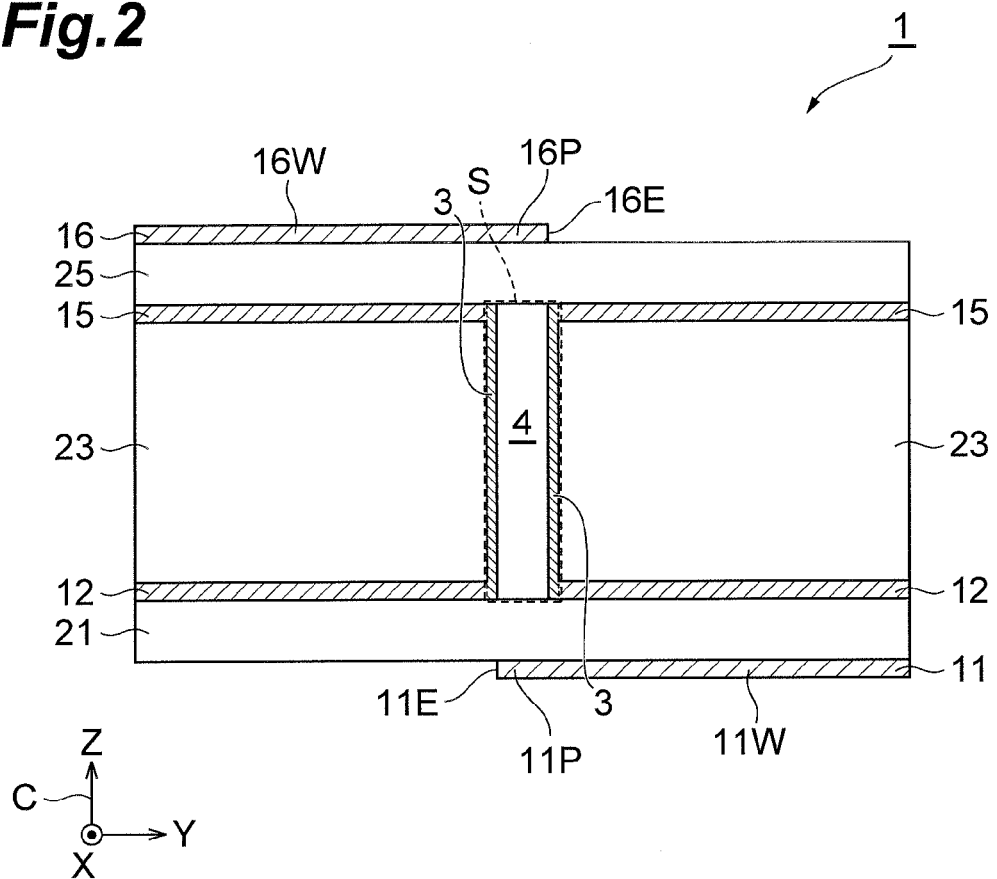
FIG. 2 is a cross-sectional view taken along line II-II represented in FIG. 1.

FIG. 1 is an exploded perspective view that illustrates a multilayered transmission line plate 1 having an electromagnetic coupling structure according to this embodiment. FIG. 2 is a cross-sectional view taken along line II-II represented in FIG. 1. In the multilayered transmission line plate 1, a first conductive layer 11, a first dielectric layer 21, a second conductive layer 12, a second dielectric layer 23, a third conductive layer 15, a third dielectric layer 25, and a fourth conductive layer 16 are stacked in the mentioned order. Here, the second dielectric layer 23 corresponds to an inner dielectric layer, the second conductive layer 12 and the third conductive layer 15 correspond to inner conductive layers that are a plurality of ground layers, the first and third dielectric layers 21 and 25 correspond to one pair of outer dielectric layers, and the first and fourth conductive layers 11 and 16 correspond to one pair of outer conductive layers.

The first conductive layer 11 is a part that forms a first transmission line. Similarly, the fourth conductive layer 16 is a part that forms a second transmission line. The first and second transmission lines are high-frequency transmission lines to be electromagnetically connected together. The first conductive layer 11 forming the first transmission line extends in the in-plane direction of the first dielectric layer 21, and the fourth conductive layer 16 forming the second transmission line extends in the in-plane direction of the third dielectric layer 25.

Each one of the front ends of one pair of the outer conductive layers 11 and 16 that are electromagnetically coupled forms a patch shape. More specifically, the first conductive layer 11 includes a wiring portion 11W and a conductive patch portion 11P that is disposed at the front end of the wiring portion 11W. Similarly, the fourth conductive layer 16 includes a wiring portion 16W and a conductive patch portion 16P that is disposed at the front end of the wiring portion 16W.

Each one of the wiring portions 11W and 16W forms a rectangular shape and extends in the Y direction as the direction of a long axis. Each one of the conductive patch portions 11P and 16P forms a rectangular shape and extends in the X direction as the direction of a long axis. In other words, in the first conductive layer 11, the conductive patch portion 11P extends in a direction (the X direction in the example illustrated in FIG. 1) perpendicular to the direction (the Y direction in the example illustrated in FIG. 1) in which the wiring portion 11W extends. Similarly, in the fourth conductive layer 16, the conductive patch portion 16P extends in a direction (the X direction illustrated in FIG. 1) perpendicular to the direction (the Y direction in the example illustrated in FIG. 1) in which the wiring portion 16W extends.

The conductive patch portions 11P and 16P have portions longer than the widths of the wiring portions 11W and 16W in the direction (the X direction in the example illustrated in FIG. 1) perpendicular to the direction (the Y direction in the example illustrated in FIG. 1) in which the wiring portions 11W and 16W extend. In other words, the conductive patch portions 11P and 16P are formed as patch portions at the front ends of the wiring portions 11W and 16W. However, as will be described later, the conductive patch portions 11P and 16P are patterned to be formed simultaneously with the wiring portions 11W and 16W. In other words, the conductive patch portions 11P and 16P are made of the same material as that of the wiring portions 11W and 16W and have principal planes common to the wiring portions 11W and 16W.

In addition, the extending directions (the Y direction and the X direction illustrated in FIG. 1) of the conductive patch portions 11P and 16P and the wiring portions 11W and 16W are perpendicular to the stacking direction (the Z direction illustrated in FIGS. 1 and 2) of the first conductive layer 11, the first dielectric layer 21, the second conductive layer 12, the second dielectric layer 23, the third conductive layer 15, the third dielectric layer 25, and the fourth conductive layer 16.

The second conductive layer 12 and the third conductive layer 15 are ground conductors forming ground layers.

The first, second, and third dielectric layers 21, 23, and 25 are parts used for electrically insulating the first, second, third, and fourth conductive layers 11, 12, 15, and 16 from each other. The first, second, and third dielectric layers 21, 23, and 25 are made of insulating materials such as ceramic, Teflon (registered trademark), polyphenylene ether, a modified product of polyphenylene ether, and a liquid crystal polymer. In addition, the first and third dielectric layers 21 and 25 may include glass fibers. In a case where a low-loss material is used for the second dielectric layer 23, the transmission line plate has a low loss as a whole, which is preferable. However, since the second dielectric layer 23 does not have influence on the loss of the electromagnetic coupling structure, an ordinary epoxy substrate of an FR-4 level or the like may be used in consideration of the cost. In addition, the second dielectric layer 23 may include a glass fiber.

In the multilayered transmission line plate 1, a hole S passing through the second conductive layer 12, the second dielectric layer 23, and the third conductive layer 15 is formed. In the examples illustrated in FIGS. 1 and 2, the hole S, which is a through hole, is disposed in an area in which one conductive patch portion 11P faces the other conductive patch portion 16P. In the inner wall of the hole S, a metal film 3 having a tubular shape is formed. The metal film 3 is a plated film, for example, formed by electroless plating or the like. The metal film 3 is formed over the entire face of the inner wall of the hole S. Since the second and third conductive layers 12 and 15 are electrically connected to each other through the metal film 3, the first conductive layer 11 forming the first transmission line and the fourth conductive layer 16 forming the second transmission line are electromagnetically coupled.

In the hole S in which the metal film 3 is formed, a dielectric 4 having low dielectric loss tangent is filled. In this embodiment, the dielectric 4 having dielectric loss tangent of 0 to 0.0300 for 10 GHz is filled in the hole S. Since the transmission loss increases in proportion to the dielectric loss tangent of the material, by filling a dielectric having low dielectric loss tangent in the hole S, the transmission loss can be suppressed. The dielectric 4 that is filled in the hole S may be air. Also in such a case, the transmission loss can be suppressed. In such a case, the process of filling the dielectric 4 can be simplified, which is preferable.

In the example illustrated in FIG. 1, the cross section of the hole S that is cut to be parallel to the XY plane forms a shape in which semi-circle portions protrude toward the outside of band-shaped portions at both ends of the band-shaped portions extending in the X direction.

Figure 3:
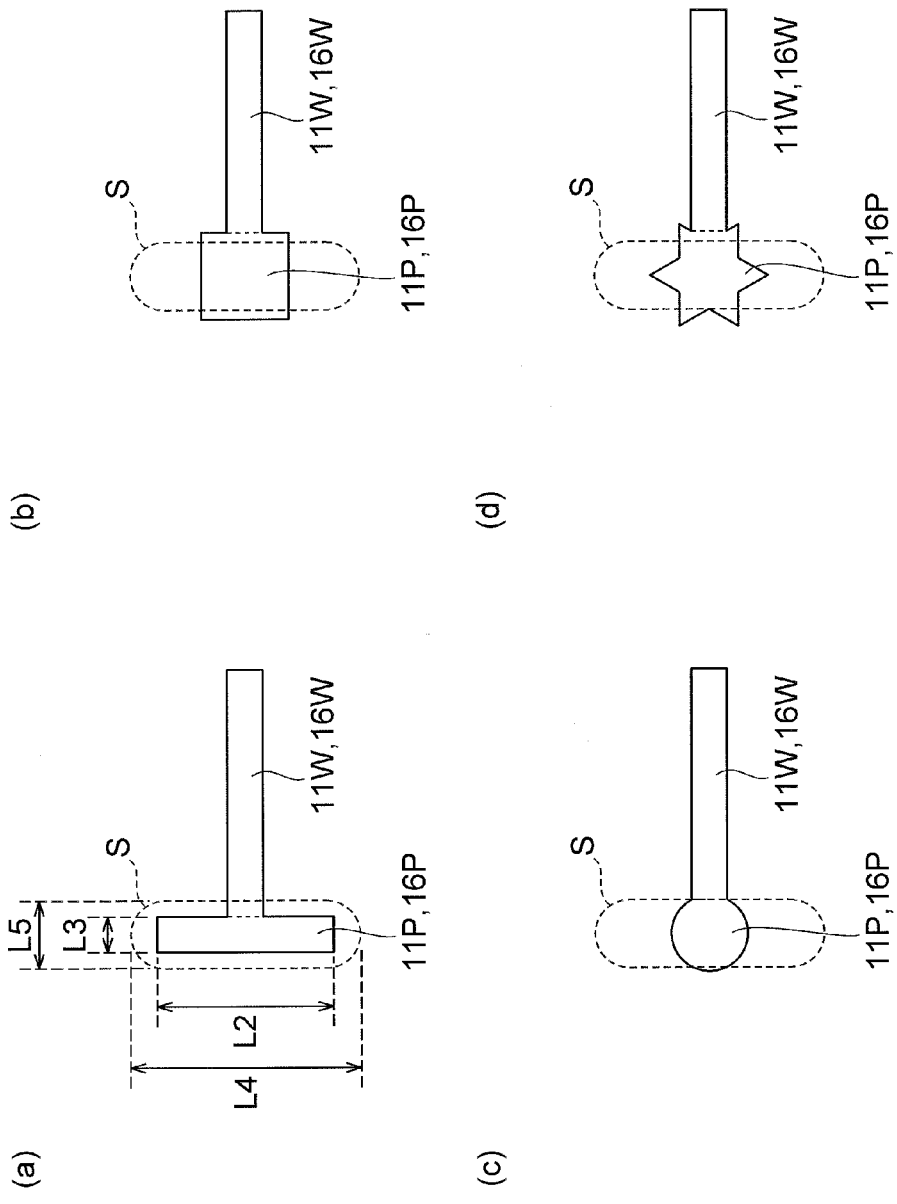
FIGS. 3(a) to 3(d) are top views that illustrate the relations between conductive patch portions and a hole.

FIG. 3(a) is a top view that illustrates the relation between the conductive patch portions 11P and 16P and the hole S. As illustrated in FIG. 3(a), in this embodiment, the conductive patch portions 11P and 16P overlap the area of the hole S when seen in the stacking direction. Here, the length L2 of the conductive patch portions 11P and 16P in the long axis direction and the length L3 thereof in the short axis direction are preferably equal to or less than an effective wavelength λ corresponding to a frequency of the frequency band used in the multilayered transmission line plate 1, are more preferably equal to or less than λ/2, and are further more preferably equal to or less than λ/4. Here, for example, λ is in the range of 1.5 mm to 30 mm.

By setting the lengths to be equal to or less than λ, strong electromagnetic coupling between the hole S and the conductive patch portions 11P and 16P is acquired, whereby the transmission loss can be suppressed. When the dimensions of the conductive patch portions 11P and 16P are excessively large, radiation occurs from the conductive patch portions 11P and 16P, and accordingly, there is a possibility of increasing the loss. In addition, by setting the lengths to be equal to or less than λ/2, the pattern area can be reduced, whereby an efficient pattern arrangement can be made. More preferably, the lengths are set to be equal to or larger than λ/16 and equal to or less than λ/2. In addition, by setting the lengths to be equal to or less than λ/4, more stronger electromagnetic coupling between the hole S and the conductive patch portions 11P and 16P is acquired, whereby a form is acquired which is the most suitable for signal transmission with low loss. However, when the lengths are set to be less than λ/16, the influence of the dimension precision (for example, the precision of etching in a patterning process or the like) at the time of producing the substrate of the multilayered transmission line plate 1 tends to increase.

The width L4 of the hole S in a direction perpendicular to the extending direction of the wiring portions 11W and 16W is set to be equal to or less than an effective wavelength λ corresponding to a frequency of the frequency band used in the multilayered transmission line plate 1. By setting the width L4 of the hole S as such, an electromagnetic coupling structure having a low-loss transmission characteristic can be formed. In addition, the width L5 of the hole in the extending direction of the wiring portions 11W and 16W is shorter than the width L4 of the hole S in a direction perpendicular to the extending direction of the wiring portions 11W and 16W.

Hereinafter, an example of a method for producing the multilayered transmission line plate 1 will be described with reference to FIGS. 4 and 5. First, as illustrated in FIG. 4(a), a laminated body in which conductive layers 12a and 15a made of copper foils or the like are formed on both faces of a dielectric layer 23a is prepared. Thereafter, as illustrated in FIG. 4(b), by making a hole in the laminated body using a drill or the like, a dielectric layer 23 having a hole S and including the conductive layers 12a and 15a on both faces thereof is formed. Subsequently, a metal film 3 is formed in the inner wall of the hole S. For example, as illustrated in FIG. 4(c), by performing, for example, an electroless plating process for the laminated body in which the hole S is formed, the metal film 3 is formed in the inner wall of the hole S, and conductive layers 12 and 15 thicker than the conductive layers 12a and 15a illustrated in FIG. 4(b) are formed on both faces of the dielectric layer 23. From this, as illustrated in FIG. 4(c), a laminated body 30 in which the metal film 3 is formed in the inner wall of the hole S passing through one pair of the conductive layers 12 and facing each other with the dielectric layer 23 interposed therebetween is acquired. The thickness of the metal film 3 is preferably equal to or more than 5 μm and equal to or less than 50 μm and is more preferably equal to or more than 10 μm and equal to or less than 50 μm. When the thickness of the metal film 3 is less than 5 μm, there is concern that the metal film 3 may not be uniformly formed.

Thereafter, a dielectric 4 is filled in the hole S in which the metal film 3 is formed. As illustrated in FIG. 5(a), the surface of the dielectric 4 is ground so as to be flattened. Thereafter, as illustrated in FIG. 5(b), one pair of dielectric layers 21 and 25 are configured to face each other with the laminated body 30 interposed therebetween, and one pair of conductive layers 11a and 16a are configured to face each other with the dielectric layers 21 and 25 interposed therebetween, and the layers are heated and bonded in a pressing manner. From this, a structure body can be formed in which the conductive layer 11a, the dielectric layer 21, the conductive layer 12, the dielectric layer 23, the conductive layer 15, the dielectric layer 25, and the conductive layer 16a are stacked in the mentioned order. Finally, by patterning one pair of the conductive layers 11a and 16a, for example, through etching, one pair of outer conductive layers 11 and 16 including wiring portions 11W and 16W and conductive patch portions 11P and 16P disposed at the front ends of the wiring portions 11W and 16W are formed. At this time, as illustrated in FIG. 5(c), at positions facing each other with the hole S interposed therebetween, the conductive patch portions 11P and 16P are arranged. The multilayered transmission line plate 1 having the electromagnetic coupling structure as illustrated in FIGS. 1 and 2 is acquired as above.

In the multilayered transmission line plate 1 having the electromagnetic coupling structure as above, the transmission loss can be decreased. The reason for this is that, as illustrated in FIG. 2, in the multilayered transmission line plate 1, one pair of the conductive patch portions 11P and 16P are included, and electromagnetic field modes above the first conductive layer 11 and the fourth conductive layer 16 forming transmission lines have the relation of a "mirror image" with a laminated body of the second conductive layer 12 and the third conductive layer 15 forming the ground layers and the metal film 3 electrically connecting the second and third conductive layers 12 and 15 to each other interposed therebetween. In other words, the laminated body is arranged at the center of the multilayered transmission line plate 1, which is a center position of the mirror image phenomenon of the transmission line, in the stacking direction. By employing such a configuration, the electromagnetic field is stable, and strong mode coupling is acquired, whereby the transmission loss is suppressed.

In addition, in the multilayered transmission line plate 1 having the electromagnetic coupling structure described above, the conductive patch portions 11P and 16P are disposed at the front ends of the wiring portions 11W and 16W of one pair of the outer conductive layers (in other words, the first and fourth conductive layers 11 and 16) that are electromagnetically coupled. As above, by configuring the front ends of the wiring portions 11W and 16W of one pair of the outer conductive layers 11 and 16 in the shape of a patch, impedance matching between the conductive patch portions 11P and 16P and the hole S can be performed in an easy manner. At this time, unlike a conventional case, various dimensions of the electromagnetic coupling portions do not need to be precisely managed so as to satisfy predetermined inequalities in accordance with the frequency of the transmission signal and the relative dielectric constant of the dielectric. In other words, in the multilayered transmission line plate 1 having the electromagnetic coupling structure according to this embodiment, in the direction perpendicular to the extending direction of the wiring portions 11W and 16W, by using the conductive patch portions 11P and 16P having portions longer than the wiring portions 11W and 16W, even when there are variations in various dimensions of the electromagnetic coupling portions in the manufacturing step, it is hardly influenced by the dimension precision, whereby superior transmission characteristics can be maintained. Accordingly, the multilayered transmission line plate 1 that does not require high dimension precision and has a low-loss transmission characteristic can be provided.

As above, while the multilayered transmission line plate 1 having the electromagnetic coupling structure according to this embodiment has been described, the present invention is not limited thereto. For example, the ratio of the length L3 in the short axis direction to the length L2 of the conductive patch portions 11P and 16P in the long axis direction may be appropriately changed within the range of dimensions described above. In addition, the shape of the conductive patch portions 11P and 16P is not limited to a rectangular shape and, for example, may be a square shape as illustrated in FIG. 3(b), a circular shape as illustrated in FIG. 3(c), or a star shape as illustrated in FIG. 3(d). Here, the star shape represents a form acquired by eliminating a polygon from a form that is acquired by extending each side of a polygon and joining acquired intersections.

In addition, although the cross-sectional shape of the hole S preferably forms a shape formed by the band-shaped portion and the semi-circle portion as described above, the cross-sectional shape is not limited thereto and, for example, may be a circle or a rectangle. Furthermore, the inside of the hole S in which the metal film 3 is formed does not need to filled with a dielectric material and, for example, may be an air layer. Since both the dielectric constant and the dielectric loss tangent of the air are low, the transmission loss of the multilayered transmission line plate 1 is suppressed.

In addition, in the above-described embodiment, while an example has been illustrated in which the conductive patch portions 11P and 16P overlap the area of the hole S when seen in the stacking direction, the conductive patch portions 11P and 16P and the hole S are electromagnetically coupled even when they are located at a distance of some degree, and a signal can be transmitted. However, when the effective wavelength corresponding to a frequency of the frequency band used in the multilayered transmission line plate 1 is $\lambda$, it is preferable that a shortest distance between the conductive patch portions 11P and 16P and the hole S be $\lambda/2$ or less. More specifically, as illustrated in FIG. 6(a), it is preferable that a shortest distance L6 between end portions Q1 of the conductive patch portions 11P and 16P located on the side of the wiring portions 11W and 16W and an end portion R1 of the hole S located on the side of the conductive patch portions 11P and 16P be $\lambda/2$ or less. Alternatively, as illustrated in FIG. 6(b), a shortest distance L7 between end portions Q2 of the conductive patch portions 11P and 16P located on a side opposite to the side of the wiring portions 11W and 16W and an end portion R2 of the hole S located on the side of the conductive patch portions 11P and 16P is $\lambda/2$ or less. As above, when the shortest distance between the conductive patch portions 11P and 16P and the hole S is $\lambda/2$ or less, a signal can be appropriately transmitted.

Figure 6:
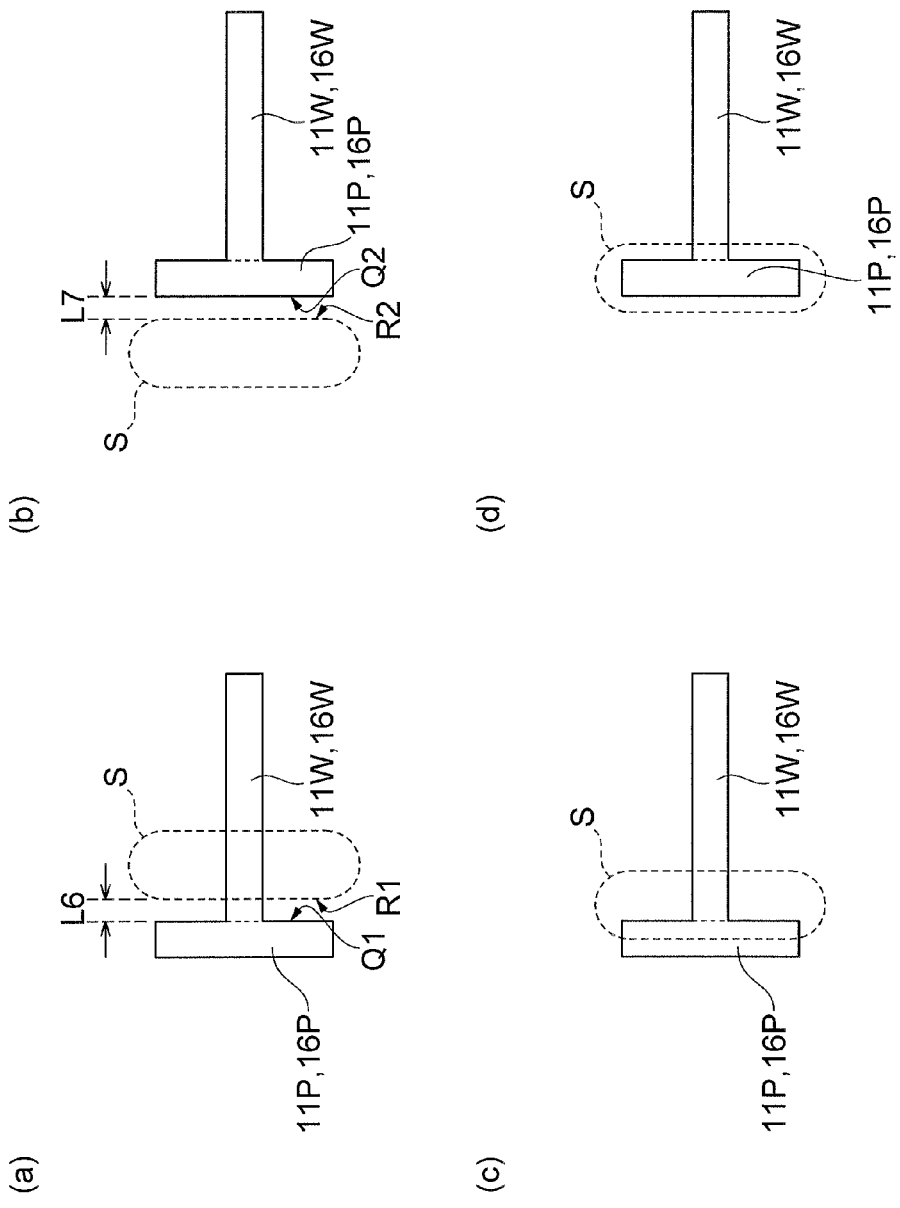
FIGS. 6(a) to 6(d) are top views that illustrate modified examples of the relation between the conductive patch portion and the hole.

As the shortest distance between the conductive patch portions 11P and 16P and the hole S decreases, the electromagnetic coupling is stronger, and accordingly, it is more preferable that the shortest distance between the conductive patch portions 11P and 16P and the hole S be $\lambda/4$ or less. In addition, as illustrated in FIGS. 6(c) and 6(d), it is further more preferable that the conductive patch portions 11P and 16P overlap at least a part of the hole S when seen in the stacking direction. By employing such an arrangement, an effective pattern arrangement can be made. In addition, the conductive patch portions 11P and 16P may have shapes other than those illustrated in FIG. 6. For example, in the case of the star shape illustrated in FIG. 3(d), a shortest distance between the conductive patch portions 11P and 16P and the hole S is a shortest distance between the front ends of protrusions and the hole S.

Furthermore, in the description presented above, while an example of the laminated body stacked with the inner dielectric layer interposed between the inner conductive layers that are a plurality of ground layers has been illustrated, the form of the laminated body is not limited thereto. For example, in the middle of the laminated body, a conductive layer other than the inner dielectric layer that is not a ground layer may be present. In such a case, for example, a structure is acquired in which a conductive layer that is not a ground layer and an inner dielectric layer are interposed between inner conductive layers that are ground layers.

In addition, as a specific structure for realizing the above-described electromagnetic coupling structure, the thickness of the second dielectric layer 23 is preferably equal to or more than 0.02 mm and equal to or less than 4 mm and is more preferably equal to or more than 0.02 mm and equal to or less than 2 mm. It is preferable that the surface of the second conductive layer 12 located on the side of the first dielectric layer 21 and the surface of the third conductive layer 15 located on the side of the third dielectric layer 25 have low surface roughness in consideration of the surface effect. The surface roughness (ten-point mean roughness; Rz) is preferably equal to or higher than 0.1 μm and equal to or lower than 9 μm, is more preferably equal to or higher than 0.1 μm and equal to or lower than 6 μm, and is further more preferably equal to or higher than 0.1 μm and equal to or lower than 3 μm. The thickness of the second and third conductive layers 12 and 15 is preferably equal to or more than 5 μm and equal to or less than 50 μm and is more preferably equal to or more than 12 μm and equal to or less than 50 μm.

As a material used for acquiring such a structure, as long as it is a general multilayered wiring plate material, there is no particular problem, and a ceramic-based or organic-based wiring plate material may be used. In order to acquire a low-cost multilayered transmission line plate 1, a general multilayered wiring plate material may be used in a wiring layer through which a high-frequency signal does not flow. Accordingly, as the second conductive layer 12, the second dielectric layer 23, and the third conductive layer 15, for example, MCL-E-679 (produced by Hitachi Chemical Company, Ltd.; trade name) that is a double-sided copper clad laminated plate may be used. In addition, in order to suppress the transmission loss of the transmission line through which a high-frequency signal flows, a wiring plate material having a low dielectric constant and low dielectric loss tangent is preferable. The thickness of the first dielectric layer 21 or the third dielectric layer 25 is preferably equal to or more than 0.02 mm and equal to or less than 0.8 mm and is more preferably equal to or more than 0.07 mm and equal to or less than 0.2 mm. For example, as the first dielectric layer 21 or the third dielectric layer 25, a double-sided copper clad laminated plate MCL-FX-2 (produced by Hitachi Chemical Company, Ltd.; trade name) that is a multilayer material having low dielectric loss tangent and high heat resistance or prepreg GFA-2 (produced by Hitachi Chemical Company, Ltd.; trade name) may be used.

Regarding a copper foil used for producing the conductive layer 11 forming the first transmission line and the conductive layer 16 forming the second transmission line, the surface of the first conductive layer 11 located on the side of the first dielectric layer 21 and the surface of the fourth conductive layer 16 located on the side of the third dielectric layer 25 preferably have low surface roughness in consideration of the surface effect. The surface roughness (Rz) is preferably equal to or higher than 0.1 μm and equal to or lower than 9 μm, is more preferably equal to or higher than 0.1 μm and equal to or lower than 6 μm, and is further more preferably equal to or higher than 0.1 μm and equal to or lower than 3 μm. In addition, the thickness of the first and fourth conductive layers 11 and 16 is preferably equal to or more than 5 μm and equal to or less than 50 μm and is more preferably equal to or more than 12 μm and equal to or less than 50 μm. As such a material, for example, there is 3EC-VLP-18 (produced by Mitsui Mining and Smelting Co., Ltd.; trade name).

Figure 7:
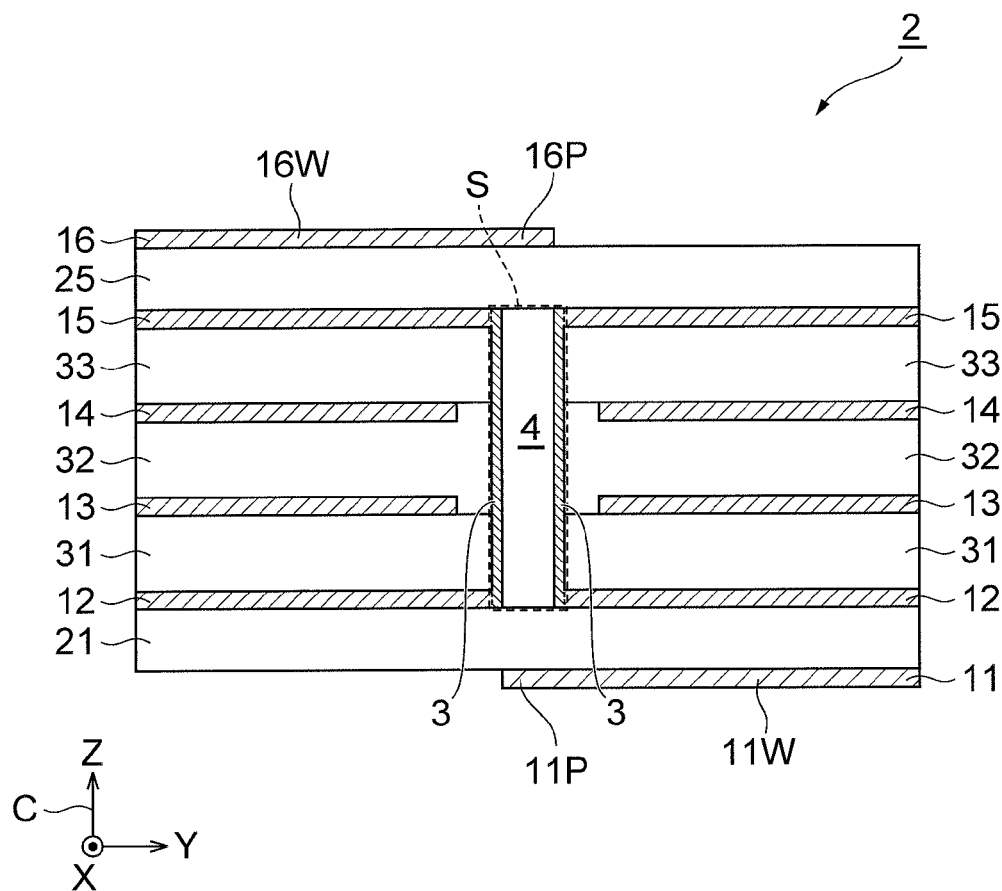
FIG. 7 is a cross-sectional view that illustrates a modified example of the multilayered transmission line plate having an electromagnetic coupling structure according to this embodiment.

In the description presented above, while an example has been illustrated in which the conductive layers are configured by a total of four layers of the first, second, third, and fourth conductive layers 11, 12, 15, and 16, there may be four or more conductive layers. For example, as illustrated in FIG. 7, there may be six conductive layers. A difference between a multilayered transmission line plate 2 illustrated in FIG. 7 and the multilayered transmission line plate 1 illustrated in FIG. 2 is that, in the multilayered transmission line plate 2, fifth and sixth conductive layers 13 and 14 are further included between the second and third conductive layers 12 and 15, and dielectric layers 31, 32, and 33 used for insulating the second, fifth, sixth, and third conductive layers 12, 13, 14, and 15 from each other are disposed.

Here, the fifth and sixth conductive layers 13 and 14 are portions that form signal lines of the inner layers. As illustrated in FIG. 7, the fifth and sixth conductive layers 13 and 14 are insulated from the metal film 3 formed in the inner wall of the hole S using the dielectric layers 31, 32, and 33. As above, the multilayered transmission line plate 2 includes: a laminated body in which a plurality of the dielectric layers 31, 32, and 33 and a plurality of the conductive layers 12, 13, 14, and 15 are alternately stacked; one pair of the dielectric layers 21 and 25 facing each other with the laminated body interposed therebetween; and one pair of conductive layers 11 and 16 facing each other with the one pair of the dielectric layers 21 and 25 interposed therebetween. This multilayered transmission line plate 2 has an electromagnetic coupling structure in which one pair of the conductive patches and the conductive layers 11 and 16 forming transmission lines are electromagnetically coupled through the metal film 3 formed in the inner wall of the hole S passing through the plurality of the dielectric layers 31, 32, and 33 and the plurality of the conductive layers 12, 13, 14, and 15. Accordingly, as described above, even when the number of layers changes, the front ends of the first and fourth conductive layers 11 and 16 form patch shapes. In other words, since the first and fourth conductive layers 11 and 16 have the conductive patch portions 11P and 16P having portions longer than the length of the wiring portions 11W and 16W in the direction perpendicular to the extending direction of the wiring portions 11W and 16W, as described above, it is hardly influenced by a dimensional variation, and accordingly, the multilayered transmission line plate 2 having a stable transmission characteristic with low loss can be provided without increasing the dimension precision of the electromagnetic coupling portions.

Hereinafter, while examples will be described, the present invention is not limited thereto. In the examples, the transmission loss of an electromagnetic coupling structure was measured in the case of a frequency band being in the range of 60 to 80 GHz. In the electromagnetic coupling structure described above, wirings (in other words, the conductive layers 11 and 16) are divided to the front and rear faces of the multilayered transmission line plate, and accordingly, it is difficult to perform high-frequency measurement using a wafer prober or the like without any change. Accordingly, in the examples described below, a multilayered transmission line plate 1A having two holes S1 and S2 as illustrated in FIGS. 8(a) and 8(b) is used instead, and, by connecting the two holes S1 and S2 in series, measurement through probing can be performed.

Example 1

First, a laminated plate (produced by Hitachi Chemical Company, Ltd.; trade name: MCL-E-679) in which copper foils were formed on both faces of a dielectric layer was prepared. The thickness of the laminated plate was 0.5 mm, and the thickness of the copper foil was 18 μm. Thereafter, a hole having a diameter of 0.25 mm and a width of 1.45 mm was formed in the laminated body using a drill having a diameter of 0.25 mm, whereby two holes S1 and S2 were formed. After copper plating was performed for the inner walls of the two holes S1 and S2, a filling resin (produced by Taiyo Ink Mfg. Co., Ltd.; trade name: DX-1; having dielectric loss tangent of 0.03 at 10 GHz) that is the dielectric 4 was printed into the holes S1 and S2, and an inner-layer circuit board was produced by grinding the surface.

Next, a copper foil (produced by Mitsui Mining and Smelting Co., Ltd.; trade name: 3EC-VLP-18) having a thickness of 18 μm, a prepreg (produced by Hitachi Chemical Company, Ltd.; trade name: GFA-2), the inner-layer circuit board, a prepreg (produced by Hitachi Chemical Company, Ltd.; trade name: GFA-2), and a copper foil (produced by Mitsui Mining and Smelting Co., Ltd.; trade name: 3EC-VLP-18) having a thickness of 18 μm overlapped each other in the mentioned order, and a multilayered transmission line plate that was laminated to be integrated under the condition of a temperature of 180° C., pressure of 3 MPa, and a time of 80 minutes was produced.

Finally, in the multilayered transmission line plate, by forming an etching resist through divisional projection exposure and patterning the upper and lower copper foils through etching, a transmission line 16A including a conductive patch portion 16P (length in the X direction: cross-sectional width of 600 μm, length in the Y direction: cross-sectional thickness of 250 μm) having a rectangular shape and a wiring portion 16W (length in the X direction: 220 μm) and a transmission line 11A including a conductive patch portion 11P (length in the X direction: cross-sectional width of 600 μm, length in the Y direction: cross-sectional thickness of 250 μm) having a rectangular shape and a wiring portion 11W (length in the X direction: 220 μm) were arranged to face each other at a position corresponding to one hole S1 formed in the inner-layer circuit board. Similarly, at a position corresponding to the other hole S2, a transmission line 16B including a conductive patch portion 16P (length in the X direction: cross-sectional width of 600 μm, length in the Y direction: cross-sectional thickness of 250 μm) having a rectangular shape and a wiring portion 16W (length in the X direction: 220 μm) and a transmission line 11A including a conductive patch portion 11P (length in the X direction: cross-sectional width of 600 μm, length in the Y direction: cross-sectional thickness of 250 μm) having a rectangular shape and a wiring portion 11W (length in the X direction: 220 μm) were arranged to face each other. Such transmission lines 16A, 16B, and 11A are microstrip lines having a characteristic impedance of 50Ω. As described above, the multilayered transmission line plate 1A having the electromagnetic coupling structure 100 including two holes S1 and S2 as illustrated in FIGS. 8(a) and 8(b) was produced.

Described in more detail, in the multilayered transmission line plate 1A, the first conductive layer 11A, which was a transmission line, the first dielectric layer 21, the second conductive layer 12, the second dielectric layer 23, the third conductive layer 15, the third dielectric layer 25, and the fourth conductive layers 16A and 16B, which were two transmission lines, were stacked in the mentioned order. As the first conductive layer 11A, a transmission line including the wiring portion 11W and the conductive patch portions 11P and 11P disposed at both ends of the wiring portion 11W was formed. In addition, as the fourth conductive layers 16A and 16B, a transmission line including the wiring portion 16W and the conductive patch portion 16P disposed at the front end of the wiring portion 16W was formed. In the multilayered transmission line plate 1A, by electrically connecting the second and third conductive layers 12 and 15 through the metal film 3 formed on the inner wall of the two holes S1 and S2, the electromagnetic coupling structure 100 is formed in which the transmission lines 11A and 16A are electromagnetically coupled, and the transmission lines 11A and 16B are electromagnetically coupled.

In the multilayered transmission line plate 1A having the electromagnetic coupling structure 100 acquired when several panels were produced as described above, the finished dimensions were measured by using an optical microscope. As a result, a distance L8 from the hole S1 to an open end 16J of the transmission line 16A, a distance L8 from the hole S1 to one open end 11J of the transmission line 11A, a distance L9 from the hole S2 to an open end 16K of the transmission line 16B, and a distance L9 from the hole S2 to the other open end 11K of the transmission line 11A were in the range of ±20 µm from the designed values thereof.

Example 2

A multilayered transmission line plate 1A was produced in the same manner as that of Example 1 except that batch parallel exposure is used when an etching resist is formed in upper and lower copper foils in the final process.

In the multilayered transmission line plate 1A having the electromagnetic coupling structure 100 acquired when several panels were produced as described above, the amounts of positional deviations were measured by using an optical microscope. As a result, a distance from the center of the hole S1 in the X direction to the center of the transmission line 16A in the X direction, a distance from the center of the hole S1 in the X direction to the center of the transmission line 11A in the X direction, a distance from the center of the hole S2 in the X direction to the center of the transmission line 16B in the X direction, and a distance from the center of the hole S2 in the X direction to the center of the transmission line 11A in the X direction were maximally −100 µm, +100 µm, −100 µm, and +100 µm from the designed values thereof.

Comparative Example 1

Figure 9:
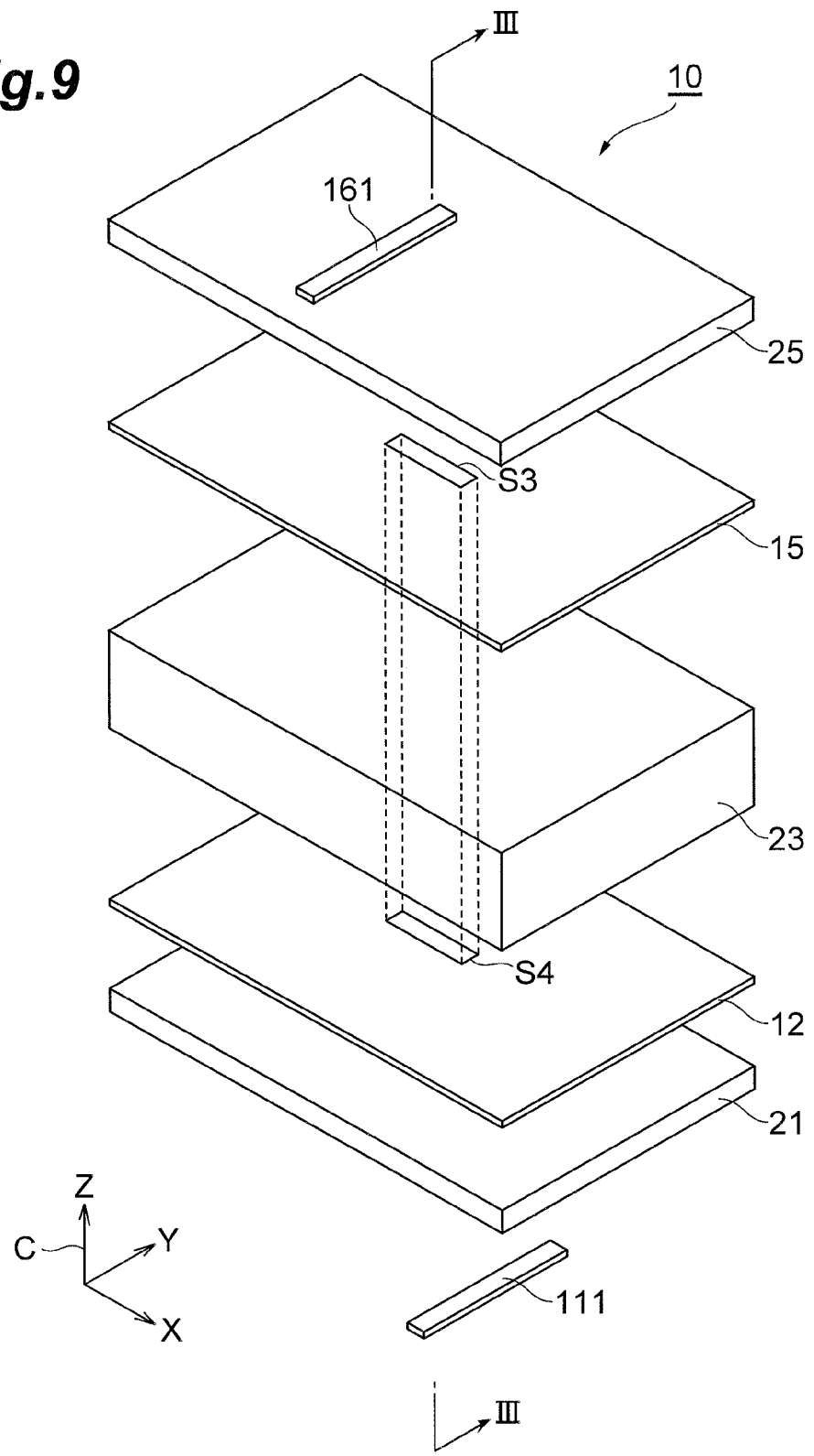
FIG. 9 is an exploded perspective view that illustrates a multilayered transmission line plate having an electromagnetic coupling structure according to a comparative example.
Figure 10:
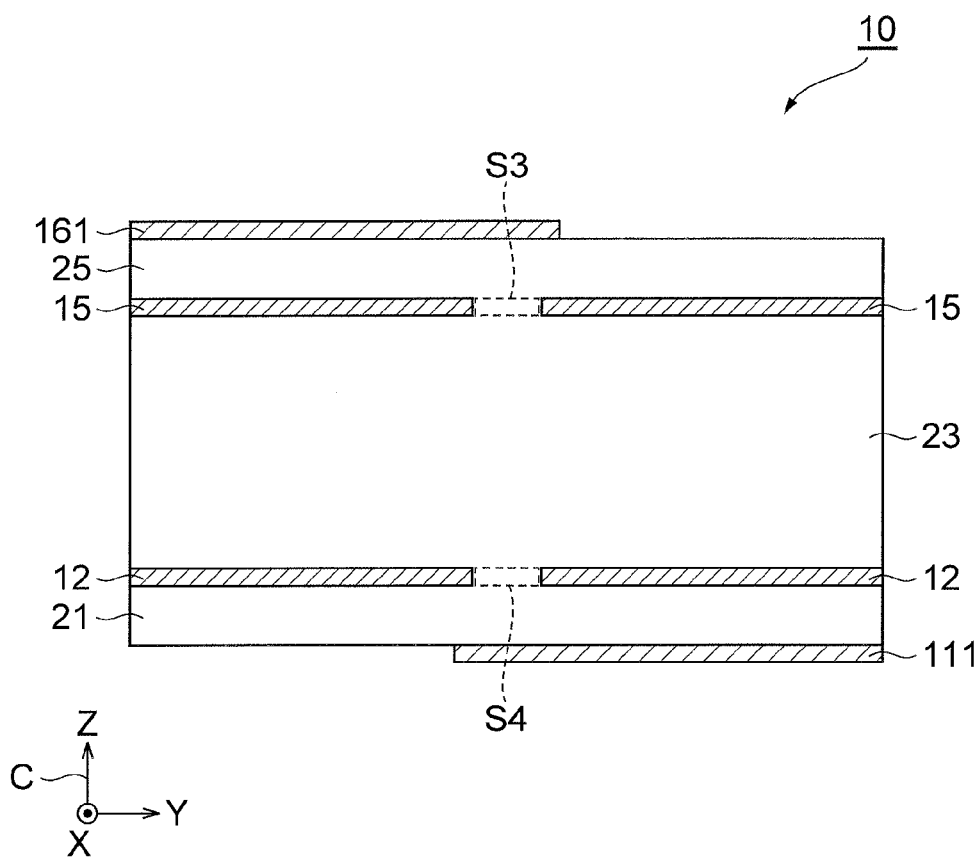
FIG. 10 is a cross-sectional view taken along line represented in FIG. 9.

In a comparative example, a multilayered transmission line plate 10 including a slot hole S3 passing through only the second conductive layer 12 and a slot hole S4 passing through only the third conductive layer 15, as illustrated in FIGS. 9 and 10, was produced. Here, the slot hole is a hole that is disposed only in a conductive layer. Accordingly, in the multilayered transmission line plate 10 of the comparative example, unlike the example, a hole passing through the second dielectric layer 23 was not formed.

Figure 11:
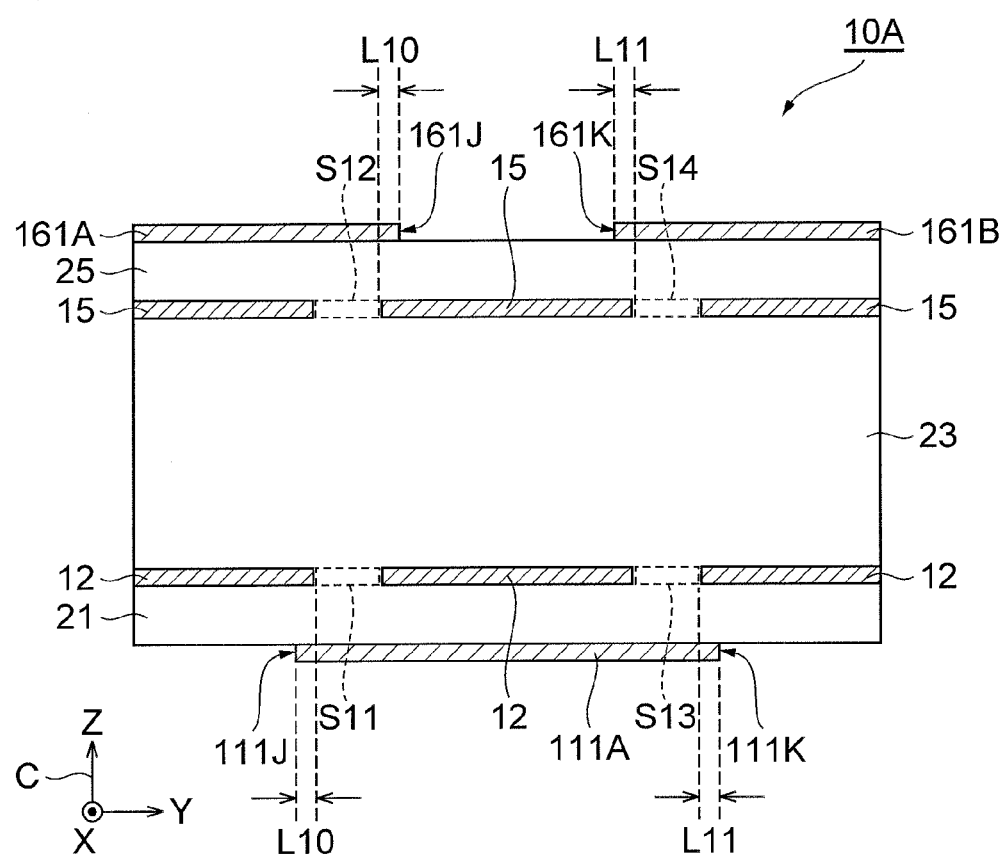
FIG. 11 is a cross-sectional view that illustrates a structure used for measuring a high-frequency characteristic of a multilayered transmission line plate having an electromagnetic coupling structure according to a comparative example.

However, since wirings (in other words, conductive layers 111 and 161) are divided to the front and rear faces of the multilayered transmission line plate 10, as described above, it is difficult to perform high-frequency measurement using a wafer prober or the like without any change. Accordingly, as illustrated in FIG. 11, a multilayered transmission line plate 10A having two wirings (in other words, the conductive layers 161A and 161B) on the front face, having one wiring (in other words, the conductive layer 111A) on the rear face, and having four slot holes S11, S12, S13, and S14 was produced. Hereinafter, a production method thereof will be described.

First, a double-sided copper clad laminated plate (produced by Hitachi Chemical Company, Ltd.; trade name: MCL-E-679) having a plate thickness of 0.5 mm and a copper foil thickness of 18 µm was prepared. By patterning the copper foil through etching, an inner-layer circuit board having four slot holes S11, S12, S13, and S14 having a major axis of 1.9 mm×a minor axis of 0.4 mm was produced. The slot holes S11 and S13 were formed to pass through only a copper foil that was the conductive layer 12, and the slot holes S12 and S14 were formed to pass through only a copper foil that was the conductive layer 15. In addition, the slot holes S11 and S12 were arranged to face each other in the stacking direction, and the slot holes S13 and S14 were arranged to face each other in the stacking direction.

Next, a copper foil (produced by Mitsui Mining and Smelting Co., Ltd.; trade name: 3EC-VLP-18) having a thickness of 18 µm, a prepreg (produced by Hitachi Chemical Company, Ltd.; trade name: GFA-2), the inner-layer circuit board, a prepreg (produced by Hitachi Chemical Company, Ltd.; trade name: GFA-2), and a copper foil (produced by Mitsui Mining and Smelting Co., Ltd.; trade name: 3EC-VLP-18) having a thickness of 18 µm overlapped each other in the mentioned order, and a multilayered transmission line plate that was laminated to be integrated under the condition of a temperature of 180° C., pressure of 3 MPa, and a time of 80 minutes was produced.

Finally, an etching resist was formed through divisional projection exposure, and, by patterning the upper and lower copper foils through etching, an open end 161J of the transmission line 161A and an open end 111J of the transmission line 111A were arranged to face each other such that distances L10 between the open end 161J of the transmission line 161A having a width of 220 µm and one open end 111J of the transmission line 111A having a width of 220 µm and the slot holes S11 and S12 formed in the inner-layer circuit board were 700 µm. Similarly, an open end 161K of the transmission line 161B and an open end 111K of the transmission line 111A were arranged to face each other such that distances L11 between the other open end 161K of the transmission line 161B having a width of 220 µm and the open end 111K of the transmission line 111A having a width of 220 µm and the slot holes S13 and S14 formed in the inner-layer circuit board were 700 µm.

The transmission lines 161A, 161B, and 111A are microstrip lines having a characteristic impedance of 50Ω. As described above, the multilayered transmission line plate 10A having the electromagnetic coupling structure 1000 including four slot holes S11, S12, S13, and S14 as illustrated in FIG. 11 was produced. Described in more detail, in the multilayered transmission line plate 10A, the transmission line 111A, the first dielectric layer 21, the second conductive layer 12, the second dielectric layer 23, the third conductive layer 15, the third dielectric layer 25, and the two transmission lines 161A and 161B were stacked in the mentioned order, and an electromagnetic coupling structure 1000 is formed in which the transmission lines 111A and 161A are electromagnetically coupled through the slot holes S11 and S12, and the transmission lines 111A and 161B are electromagnetically coupled through the slot holes S13 and S14. In this multilayered transmission line plate 10A, any conductive patch portion was not arranged in the transmission lines 161A, 161B, and 111A.

In the multilayered transmission line plate 10A having the electromagnetic coupling structure 1000 acquired when several panels were produced as described above, the finished dimensions were measured by using an optical microscope. As a result, the above-described distances L10 and L11 were in the range of ±20 μm from the designed values thereof.

Comparative Example 2

A multilayered transmission line plate 10A was produced in the same manner as that of Comparative Example 1 except that batch parallel exposure is used when an etching resist is formed in upper and lower copper foils in the final process.

In the multilayered transmission line plate 10A having the electromagnetic coupling structure 1000 acquired when several panels were produced as described above, the amounts of positional deviations were measured by using an optical microscope. As a result, a distance from the center of each one of the holes S11 and S12 in the X direction to the center of the transmission line 161A in the X direction, a distance from the center of each one of the holes S11 and S12 in the X direction to the center of the transmission line 111A in the X direction, a distance from the center of each one of the holes S13 and S14 in the X direction to the center of the transmission line 161B in the X direction, and a distance from the center of each one of the holes S13 and S14 in the X direction to the center of the transmission line 111A in the X direction were maximally −100 μm, +100 μm, −100 μm, and +100 μm from the designed values thereof.

[Measurement Result]

In the electromagnetic coupling structure 100 produced in accordance with the example and the electromagnetic coupling structure 1000 produced in accordance with the comparative example described above, by bringing a high-frequency probe (produced by Cascade Microtech Inc.; trade name: ACP-L-GSG150) into contact with the transmission lines 16A and 161A and the transmission lines 16B and 161B, power was supplied thereto from a network analyzer (produced by Agilent Technologies, Inc.; trade name HP8510C) connected through a coaxial cable (produced by Agilent Technologies Inc.; trade name E7342), and the transmission loss was measured when the power passes through the cross-sections of the transmission lines 16A and 161A and the transmission lines 16B and 161B.

Figure 12:
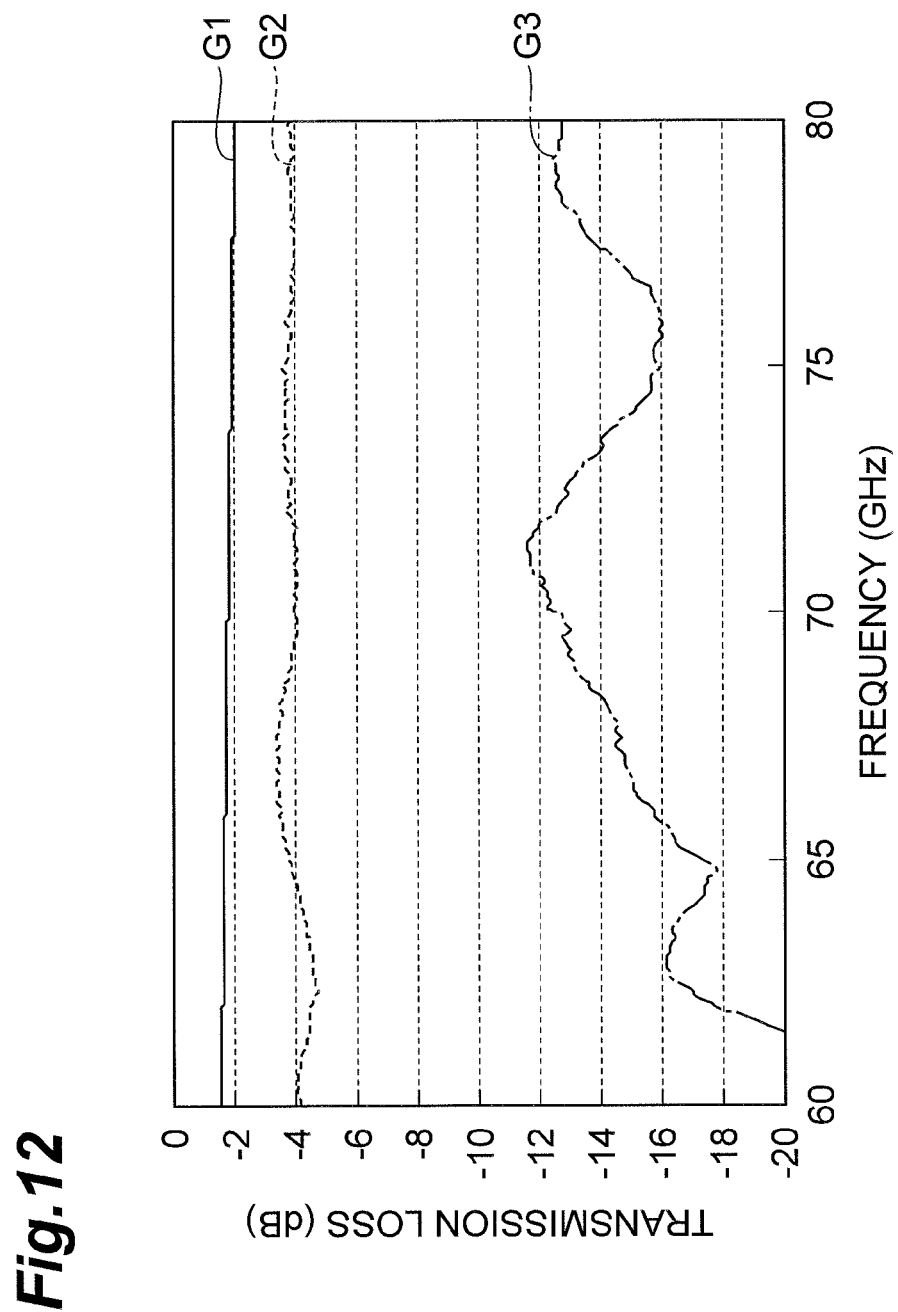
FIG. 12 is a graph that represents measurement results of high frequency characteristics of Example 1 and Comparative Example 1.
Figure 13:
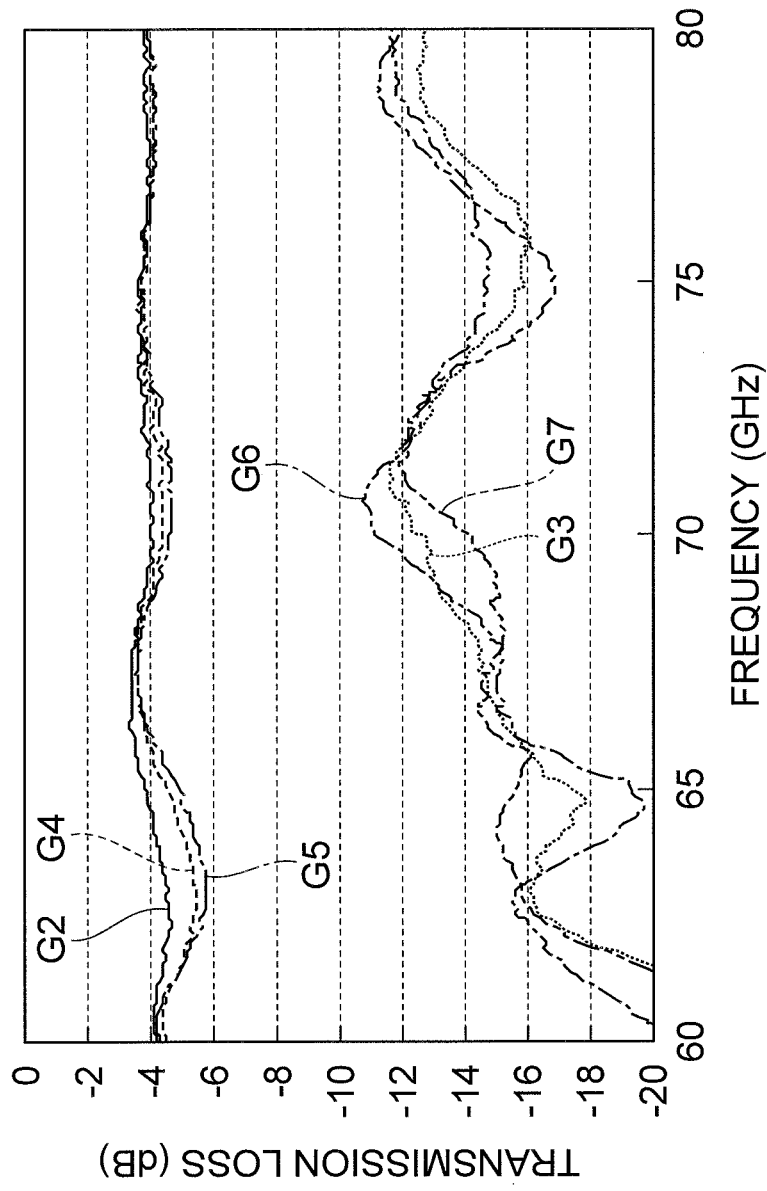
FIG. 13 is a graph that illustrates measurement results of high frequency characteristics of Example 1 and Comparative Example 1.
Figure 14:
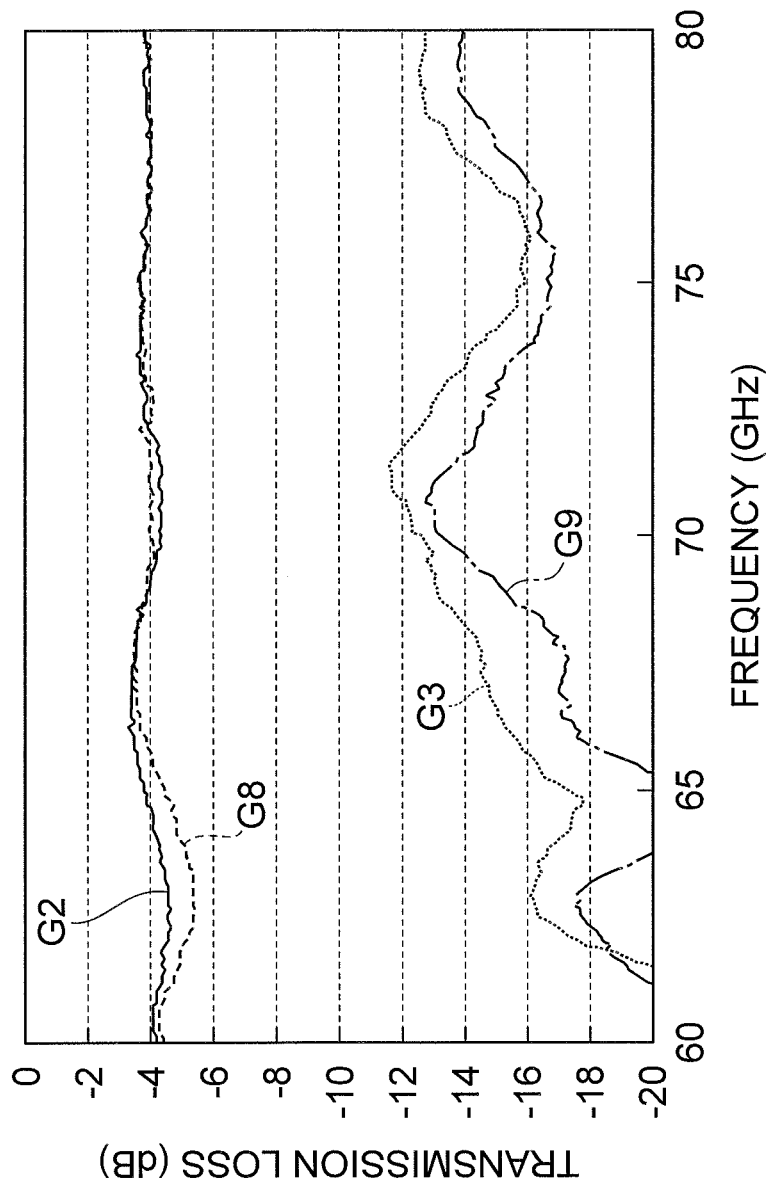
FIG. 14 is a graph that illustrates measurement results of high frequency characteristics of Examples 1 and 2 and Comparative Examples 1 and 2.

FIGS. 12 to 14 are graphs that represent results of measurements of high-frequency characteristics of Examples 1 and 2 and Comparative Examples 1 and 2. All the characteristics represented in the graphs are characteristics corresponding to two electromagnetic couplings that are formed through holes or slot holes. Accordingly, transmission loss corresponding to one electromagnetic coupling formed through a hole or a slot hole is a half of the transmission loss represented in the graph as a whole. In addition, in the graphs representing the measurement results, the transmission loss of the microstrip line used for the measurements is represented together. From this, the transmission loss of the electromagnetic coupling portion through a hole or a slot hole can be calculated. Hereinafter, description will be represented more specifically together with the calculation method.

In FIG. 12, G1 represents the transmission loss of the microstrip line. G2 represents the transmission loss of the electromagnetic coupling structure 100 corresponding to two electromagnetic couplings formed through holes of the microstrip line according to Example 1. G3 represents the transmission loss of the electromagnetic coupling structure 1000 corresponding to two electromagnetic couplings formed through holes of the microstrip line according to Comparative Example 1. In addition, in FIGS. 13, G4 and G5 represent a variation in the transmission loss of the electromagnetic coupling structure 100 according to Example 1. G6 and G7 represent a variation in the transmission loss of the electromagnetic coupling structure 1000 according to Comparative Example 1. In FIG. 14, G8 represents a variation in the transmission loss of the electromagnetic coupling structure 100 according to Example 2. G9 represents a variation in the transmission loss of the electromagnetic coupling structure 1000 according to Comparative Example 2.

In Table 1, the characteristics of the electromagnetic coupling structure 100 according to Example 1 and the electromagnetic coupling structure 1000 according to Comparative Example 1 for 75 GHz are represented together.

TABLE 1

| Item | Structure 100 | | | Structure 1000 | | |
|---|---|---|---|---|---|---|
| | −20 μm | 0 | +20 μm | −20 μm | 0 | +20 μm |
| shortest distance between front end of patch or front end of transmission line and wall face of hole (with respect to designed value) | | | | | | |
| transmission loss (dB) of measured substrate | −3.73 | −3.62 | −3.58 | −14.65 | −15.90 | −16.87 |
| transmission loss (dB) of microstrip line | −1.92 | −1.92 | −1.92 | −1.92 | −1.92 | −1.92 |
| transmission loss (dB) of inter-layer connection portion (corresponding to one) | −0.91 | −0.85 | −0.83 | −6.37 | −6.99 | −7.48 |
| variation (dB) in loss of inter-layer connection portion | | 0.08 | | | 1.11 | |

As represented by G2 illustrated in FIG. 12 or Table 1, for 75 GHz, in a case where the distances L8 and L9 are the same as the designed values in the electromagnetic coupling structure 100 according to the example, the measured transmission loss of the substrate was −3.62 dB. When the transmission loss of the microstrip line represented by G1 illustrated in FIG. 12 or represented in Table 1, which is −1.92 dB, is subtracted from this value, −1.70 dB is acquired. Since the value of −1.70 dB is the transmission loss of the electromagnetic coupling structure 100 corresponding to two electromagnetic couplings formed through the hole of the microstrip line, a half of this value, which is −0.85 dB, is the transmission loss corresponding to one coupling.

Similarly, as represented by G4 and G5 illustrated in FIG. 13 or Table 1, in a case where the distances L8 and L9 in the electromagnetic coupling structure 100 according to the example were −20 μm or +20 μm with respect to the designed values, the measured transmission loss of the substrate was −3.73 dB or −3.58 dB. When the transmission loss of the microstrip line, which is −1.92 dB, represented by G1 illustrated in FIG. 9 or Table 1 is subtracted from this value, −1.82 dB or −1.66 dB is acquired. Since the value of −1.82 or −1.66 dB is the transmission loss of the electromagnetic coupling structure 100 corresponding to two electromagnetic couplings formed through the hole of the microstrip line, a half of this value, which is −0.91 or −0.83 dB, is the transmission loss corresponding to one coupling.

In addition, as represented by G3 illustrated in FIG. 13 or Table 1, for 75 GHz, in a case where the distances L10 and L11 are the same as the designed values in the electromagnetic coupling structure 1000 according to Comparative Example 1, the measured transmission loss of the substrate is −15.90 dB. When the transmission loss of the microstrip line represented by G1 illustrated in FIG. 12 or represented in Table 1, which is −1.92 dB, is subtracted from this value, −13.98 dB is acquired. Since the value of −13.98 dB is the transmission loss of the electromagnetic coupling structure 1000 corresponding to two electromagnetic couplings formed through the slot hole of the microstrip line, a half of this value, which is −6.99 dB, is the transmission loss corresponding to one coupling.

Similarly, as represented by G6 and G7 illustrated in FIG. 13 or Table 1, in a case where the distances L10 and L11 in the electromagnetic coupling structure 1000 according to Comparative Example 1 were −20 μm or +20 μm with respect to the designed values, the measured transmission loss of the substrate was −14.65 dB or −16.87 dB. When the transmission loss of the microstrip line, which is −1.92 dB, represented by G1 illustrated in FIG. 12 or Table 1 is subtracted from this value, −12.73 dB or −14.95 dB is acquired. Since the value of −12.73 or −14.95 dB is the transmission loss of the electromagnetic coupling structure 1000 corresponding to two electromagnetic couplings formed through the slot hole of the microstrip line, a half of this value, which is −6.37 or −7.48 dB, is the transmission loss corresponding to one coupling.

In addition, in Table 2, the characteristics of the electromagnetic coupling structure 100 according to Example 2 and the electromagnetic coupling structure 1000 according to Comparative Example 2 for 75 GHz are represented together.

TABLE 2

| Item | Structure 100 | | Structure 1000 | |
| --- | --- | --- | --- | --- |
| | pattern positional deviation (X direction, with respect to designed value) | | | |
| | 0 | ±100 μm | 0 | ±100 μm |
| transmission loss (dB) of measured substrate | −3.62 | −3.66 | −15.90 | −16.66 |
| transmission loss (dB) of microstrip line | −1.92 | −1.92 | −1.92 | −1.92 |
| transmission loss (dB) of inter-layer connection portion (corresponding to one coupling) | −0.85 | −0.87 | −6.99 | −7.37 |
| variation (dB) in loss of inter-layer connection portion | | 0.02 | | 0.38 |

As represented by G8 illustrated in FIG. 14 or Table 2, in the electromagnetic coupling structure 100 according to Example 2, in a case where a distance from the center of the hole S1 in the X direction to the center of the transmission line 16A in the X direction, a distance from the center of the hole S1 in the X direction to the center of the transmission line 11A in the X direction, a distance from the center of the hole S2 in the X direction to the center of the transmission line 16B in the X direction, and a distance from the center of the hole S2 in the X direction to the center of the transmission line 11A in the X direction were ±100 μm with respect to the designed values, the measured transmission loss of the substrate was −3.66 dB. The transmission loss corresponding to one inter-layer connection portion that was acquired from this was −0.87 dB.

Similarly, as represented by G9 illustrated in FIG. 14 or Table 2, in the electromagnetic coupling structure 1000 according to Comparative Example 2, in a case where a distance from the center of each one of the holes S11 and S12 in the X direction to the center of the transmission line 161A in the X direction, a distance from the center of each one of the holes S11 and S12 in the X direction to the center of the transmission line 111A in the X direction, a distance from the center of each one of the holes S13 and S14 in the X direction to the center of the transmission line 161B in the X direction, and a distance from the center of each one of the holes S13 and S14 in the X direction to the center of the transmission line 111A in the X direction were ±100 μm with respect to the designed values thereof, the measured transmission loss of the substrate was −16.66 B. The transmission loss corresponding to one inter-layer connection portion that was acquired from this was −7.37 dB.

Accordingly, the transmission loss at the frequency band of 75 GHz in the electromagnetic coupling structures 100 according to Examples 1 and 2 is less than that in the electromagnetic coupling structures 1000 according to Comparative Examples 1 and 2. In addition, as illustrated in FIG. 12, over the frequency band of 60 to 80 GHz, the transmission loss of the electromagnetic coupling structures 100 according to Examples 1 and 2 is less than that of the electromagnetic coupling structure 1000 according to Comparative Examples 1 and 2.

In addition, a loss variation that is acquired by subtracting minimum transmission loss from maximum transmission loss of the inter-layer connection portion at 75 GHz was 0.08 dB in Example 1 and was 1.11 dB in Comparative Example 1. In addition, the loss variation was 0.02 dB in Example 2 and was 0.38 dB in Comparative Example 2. Accordingly, the loss variation in the electromagnetic coupling structures 100 according to Examples 1 and 2 is markedly smaller than that in the electromagnetic coupling structures 1000 according to Comparative Examples 1 and 2.

As above, the transmission loss of the multilayered transmission line plate 1A as in the example is smaller than that of a conventional multilayered transmission line plate 10A as in the comparative example. This is due to weak electromagnetic coupling between transmission lines in the conventional multilayered transmission line plate. There are two reasons for the weak electromagnetic coupling. The first reason is in that a distance between the transmission lines becomes farther from each other by a length corresponding to the thickness of the multilayered structure that is present between the transmission lines. The second reason is in that a design technique enabling strong electromagnetic coupling using the "mirror image" relation is not used in the conventional multilayered transmission line plate.

In the multilayered transmission line plate 1A as in the example, electromagnetic field modes above the conductive layer 11A and the conductive layers 16A and 16B forming transmission lines have the relation of the "mirror image" with a laminated body of the conductive layers 12 and 15 serving as ground layers and the metal film 3 electrically connecting the conductive layers 12 and 15 to each other interposed therebetween. In other words, the laminated body is arranged at the center of the multilayered transmission line plate 1A, which is a center position of the mirror image phenomenon of the transmission lines, in the stacking direction. According to such a configuration, the electromagnetic field is stabilized, and a strong mode coupling is acquired, whereby the transmission loss is suppressed.

In contrast to this, in the conventional multilayered transmission line plate 10A as in the comparative example, the dielectric layer 23 is present at the center position of the mirror image phenomenon of the conductive layer 111A and the conductive layers 161A and 161B forming the transmission lines, and there is no conductive layer (ground layer), whereby the mode coupling cannot be strengthened in accordance with the mirror image phenomenon.

In addition, in the multilayered transmission line plate 1A as in the example, the loss variation is smaller than that of the conventional multilayered transmission line plate 10A as in the comparative example. The reason for this is that a structure for matching the impedance with the hole is formed by configuring the front ends of the transmission lines to have a patch shape (in other words, by using the conductive patch portion having a portion longer than the wiring portion in the direction perpendicular to the extending direction of the wiring portion). In such a structure, the influence of a change in the dimension of the conductive patch portion or the like on the transmission loss is relatively low. According to the batch parallel exposure method performed in Example 2, although the a variation in the accuracy of line formation is relatively larger than that of the divisional projection exposure method, by employing the structure according to the present invention, the influence of a change in the dimension of the conductive patch portion or a positional deviation thereof on the transmission loss is low.

In contrast to this, in the conventional multilayered transmission line plate 10A, a distance between the slot hole and the open end is determined in consideration of the phase of the electromagnetic wave. The reason for this is that it is necessary to prevent an electromagnetic wave from being weakened above the slot hole due to interference between the progressive wave and the reflected wave. In such a structure, since a distance between the open end of the transmission line and the slot hole is extremely important, the influence of a change in the dimension of the pattern on the transmission loss is high.

REFERENCE SIGNS LIST 1 multilayered transmission line plate
11 first conductive layer
11W wiring portion
11P conductive patch portion
12 second conductive layer
15 third conductive layer
16 fourth conductive layer
16W wiring portion
16P conductive patch portion
21 first dielectric layer
23 second dielectric layer
25 third dielectric layer
3 metal film
S hole

The invention claimed is:

1. An electromagnetic coupling structure used in a frequency band of a microwave zone, the electromagnetic coupling structure comprising:
a laminated body that is laminated with an inner dielectric layer interposed between inner conductive layers that are a plurality of ground layers;
one pair of outer dielectric layers that face each other with the laminated body interposed between the outer dielectric layers; and
one pair of outer conductive layers that face each other with the one pair of outer dielectric layers interposed between the outer conductive layers,
wherein each one of the one pair of outer conductive layers includes a wiring portion and a conductive patch portion disposed at a front end of the wiring portion,
the conductive patch portion has a portion longer than a width of the wiring portion in a direction perpendicular to an extending direction of the wiring portion,
a hole passing through the inner dielectric layer and the inner conductive layers that are the plurality of ground layers is formed in the laminated body, and
a tube-shaped metal film formed on an inner wall of the hole electrically connecting the inner conductive layers that are a plurality of ground layers, whereby the one pair of outer conductive layers are electromagnetically coupled.

2. An electromagnetic coupling structure used in a frequency band of a microwave zone,
wherein a first conductive layer, a first dielectric layer, a second conductive layer, a second dielectric layer, a third conductive layer, a third dielectric layer, and a fourth conductive layer are stacked in this order,
each one of the first and fourth conductive layers includes a wiring portion and a conductive patch portion disposed at a front end of the wiring portion,
the conductive patch portion has a portion longer than a width of the wiring portion in a direction perpendicular to an extending direction of the wiring portion,
a hole passing through the second conductive layer, the second dielectric layer, and the third conductive layer is formed, and
a tube-shaped metal film formed on an inner wall of the hole electrically connecting the second conductive layer and the third conductive layer to each other, whereby the first conductive layer and the fourth conductive layer are electromagnetically coupled.

3. The electromagnetic coupling structure according to claim 1, wherein the tube-shaped metal film is a plating film.

4. A multilayered transmission line plate used in a frequency band of a microwave zone, the multilayered transmission line plate comprising:
a laminated body that is laminated with an inner dielectric layer interposed between inner conductive layers that are a plurality of ground layers;
one pair of outer dielectric layers that face each other with the laminated body interposed between the outer dielectric layers; and
one pair of outer conductive layers that face each other with the one pair of outer dielectric layers interposed between the outer conductive layers and forms transmission lines,
wherein each one of the one pair of outer conductive layers includes a wiring portion and a conductive patch portion disposed at a front end of the wiring portion,
the conductive patch portion has a portion longer than a width of the wiring portion in a direction perpendicular to an extending direction of the wiring portion,
a hole passing through the inner dielectric layer and the inner conductive layers that are the plurality of ground layers is formed in the laminated body, and
a tube-shaped metal film formed on an inner wall of the hole electrically connecting the inner conductive layers that are a plurality of ground layers, whereby the one pair of outer conductive layers are electromagnetically coupled.

5. A multilayered transmission line plate used in a frequency band of a microwave zone,
   wherein a first conductive layer forming a first transmission line, a first dielectric layer, a second conductive layer, a second dielectric layer, a third conductive layer, a third dielectric layer, and a fourth conductive layer forming a second transmission line are stacked in this order,
   each one of the first and fourth conductive layers includes a wiring portion and a conductive patch portion disposed at a front end of the wiring portion,
   the conductive patch portion has a portion longer than a width of the wiring portion in a direction perpendicular to an extending direction of the wiring portion,
   a hole passing through the second conductive layer, the second dielectric layer, and the third conductive layer is formed, and
   a tube-shaped metal film formed on an inner wall of the hole electrically connecting the second conductive layer and the third conductive layer to each other, whereby the first conductive layer and the fourth conductive layer are electromagnetically coupled.

6. The multilayered transmission line plate according to claim 4, wherein the tube-shaped metal film is a plating film.

7. The electromagnetic coupling structure according to claim 1, wherein a width of the hole in a direction perpendicular to the extending direction of the wiring portion is set to be an effective wavelength corresponding to a frequency used in the frequency band or less.

8. The multilayered transmission line plate according to claim 4, wherein a width of the hole in a direction perpendicular to the extending direction of the wiring portion is set to be an effective wavelength corresponding to a frequency used in the frequency band or less.

9. The electromagnetic coupling structure according to claim 1, wherein a dielectric having dielectric loss tangent of 0 to 0.0300 at 10 GHz is filled in the hole in which the tube-shaped metal film is formed.

10. The electromagnetic coupling structure according to claim 1, wherein air is filled in the hole in which the tube-shaped metal film is formed.

11. The multilayered transmission line plate according to claim 4, wherein a dielectric having dielectric loss tangent of 0 to 0.0300 at 10 GHz is filled in the hole in which the tube-shaped metal film is formed.

12. The multilayered transmission line plate according to claim 4, wherein air is filled in the hole in which the tube-shaped metal film is formed.

* * * * *